US011038097B2

(12) United States Patent
Doris et al.

(10) Patent No.: US 11,038,097 B2
(45) Date of Patent: Jun. 15, 2021

(54) MAGNETIC STRUCTURES WITH TAPERED EDGES

(71) Applicant: International Business Machines Corporation, Armonk, NY (US)

(72) Inventors: Bruce B. Doris, Slingerlands, NY (US); Oscar van der Straten, Guilderland Center, NY (US); Alexander Reznicek, Troy, NY (US); Praneet Adusumilli, Somerset, NJ (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 16/576,242

(22) Filed: Sep. 19, 2019

(65) Prior Publication Data

US 2021/0091300 A1  Mar. 25, 2021

(51) Int. Cl.
*H01L 43/02* (2006.01)
*H01L 43/12* (2006.01)
(Continued)

(52) U.S. Cl.
CPC ......... *H01L 43/02* (2013.01); *H01F 10/3254* (2013.01); *H01F 10/3286* (2013.01);
(Continued)

(58) Field of Classification Search
CPC ..... H01L 43/02; H01L 43/12; H01F 10/3254; H01F 10/3286; H01F 41/12; H01F 41/14
(Continued)

(56) References Cited

U.S. PATENT DOCUMENTS 6,635,546 B1  10/2003  Ning
7,306,954 B2  12/2007  Nejad et al.
(Continued)

FOREIGN PATENT DOCUMENTS

JP  10255229 A  9/1998

OTHER PUBLICATIONS

International Search Report dated Nov. 30, 2020 received in International Application No. PCT/IB2020/057726 10 pages.

*Primary Examiner* — David Vu
*Assistant Examiner* — Brandon C Fox
(74) *Attorney, Agent, or Firm* — Scully, Scott, Murphy & Presser, P.C.; Daniel P. Morris, Esq.

(57) ABSTRACT

Magnetic structures including magnetic inductors and magnetic tunnel junction (MTJ)-containing structures that have tapered sidewalls are formed without using an ion beam etch (IBE). The magnetic structures are formed by providing a material stack of a dielectric capping layer and a sacrificial dielectric material layer above a lower interconnect level. First and second etching steps are performed to pattern the sacrificial dielectric material layer and the dielectric capping layer such that a patterned dielectric capping layer is provided with a tapered sidewall. After removing the sacrificial dielectric material layer, a magnetic material-containing stack is formed within the opening in the patterned dielectric capping layer and atop the patterned dielectric capping layer. A planarization process is then employed to pattern the magnetic-containing stack by removing the magnetic material-containing stack that is located atop the patterned dielectric capping layer.

25 Claims, 15 Drawing Sheets

(51) Int. Cl.
*H01F 10/32* (2006.01)
*H01F 41/14* (2006.01)
*H01F 41/12* (2006.01)

(52) U.S. Cl.
CPC ............ *H01F 41/12* (2013.01); *H01F 41/14* (2013.01); *H01L 43/12* (2013.01)

(58) Field of Classification Search
USPC .............................................. 257/421; 438/3
See application file for complete search history.

(56) References Cited

U.S. PATENT DOCUMENTS

| | | |
|---|---|---|
| 7,374,952 B2 | 5/2008 | Kasko et al. |
| 7,411,817 B2 | 8/2008 | Nozieres et al. |
| 8,590,139 B2 | 11/2013 | Op De Beeck et al. |
| 8,723,514 B2 | 5/2014 | Finkler et al. |
| 8,803,266 B2 | 8/2014 | Kim et al. |
| 9,287,494 B1 | 3/2016 | Yan et al. |
| 10,345,397 B2 | 7/2019 | Mazotti et al. |
| 10,403,424 B2 | 9/2019 | Wang et al. |
| 2004/0201070 A1 | 10/2004 | Deak |
| 2006/0033136 A1* | 2/2006 | Liu .................. H01L 43/08 257/296 |
| 2006/0132972 A1 | 6/2006 | Tagami et al. |
| 2011/0233696 A1* | 9/2011 | Li .................. G11C 11/161 257/421 |
| 2014/0021566 A1* | 1/2014 | Park .................. H01L 43/02 257/421 |
| 2017/0170390 A1* | 6/2017 | Swerts ................ H01L 43/10 |
| 2017/0279036 A1* | 9/2017 | Mo .................... H01L 43/12 |
| 2017/0346000 A1 | 11/2017 | Eissa et al. |
| 2018/0040817 A1 | 2/2018 | Chuang et al. |
| 2018/0097175 A1* | 4/2018 | Chuang ................ H01L 43/08 |

\* cited by examiner

MAGNETIC STRUCTURES WITH TAPERED EDGES

BACKGROUND

The present application relates to magnetic structures and methods of forming the same. More particularly, the present application relates to magnetic inductors and magnetic tunnel junction (MTJ)-containing structures that have tapered sidewalls and are formed without using an ion beam etch (IBE).

Magnetoresistive random access memory (MRAM) is a viable memory option for stand alone and embedded applications such as, for example, internet of things (IoT), automobile, or artificial intelligence (AI). MRAM is a non-volatile random access memory technology in which data is stored by magnetic storage elements. These elements are typically formed from two ferromagnetic plates, each of which can hold a magnetization, separated by a thin dielectric layer, i.e., the tunnel barrier layer. One of the two plates is a permanent magnetic set to a particular polarity; the other plate's magnetization can be changed to match that of an external field to store memory. The permanent magnetic can be referred to as a magnetic pinned or reference layer, and the magnetic that changes magnetization to match that of an external field can be referred to as a magnetic free layer. Collectively, the magnetic pinned layer, the tunnel barrier layer and the magnetic free layer provide a multilayered magnetic tunnel junction (MTJ) pillar.

In the manufacturing of a MRAM device, blanket layers of MTJ pillar materials (i.e., a magnetic reference material, a tunnel barrier, a magnetic free material and a MTJ cap material) and a top electrode material are formed upon a bottom electrode of the MRAM device. The blanket layers are then patterned by lithography and etching, including an ion beam etch (IBE), to provide a material stack of a multilayered MTJ pillar (including remaining portions of the magnetic reference material, the tunnel barrier, the magnetic free material, and the MTJ cap material) and a top electrode located on the bottom electrode. The central problem with ion beam etching is that the IBE leaves behind metallic residue which can redeposit and cover the sidewalls of the patterned MTJ pillar. The redeposited metallic residue can cause shorting of the MTJ-containing device.

Magnetic inductors are promising devices that can be used for power management in microprocessor units (MPUs) for servers as well as cell phones and can be used for power conversion. One significant challenge for the fabrication of magnetic inductors is the patterning of the magnetic stack. Patterning of magnetic stacks is typically performed using a photoresist and an ion beam etch (IBE). As was the case above, the central problem with ion beam etching is that the IBE leaves behind metallic residue which can redeposit and cover the sidewalls of the patterned magnetic stack. The residue caused by IBE of a magnetic stack causes shorting between adjacent layers which leads to magnetic loss. This ultimately degrades the quality factor, Q, of the device which is a key parameter in magnetic inductor performance. The quality factor, Q, is the ratio of the inductor's inductive resistance to the inductor's resistance at a given frequency, and is a measure of the inductor's efficiency.

There is thus a need for providing a method of forming a magnetic structure in which the magnetic stack (i.e., magnetic inductor stack or MTJ pillar) is formed without using IBE.

SUMMARY

Magnetic structures including magnetic inductors and magnetic tunnel junction (MTJ)-containing structures that have tapered sidewalls are formed without using an ion beam etch (IBE). The term "MTJ-containing structure" is used here to denote a structure that includes a MTJ pillar and a top electrode. The magnetic structures are formed by providing a material stack of a dielectric capping layer and a sacrificial dielectric material layer above a lower interconnect level. First and second etching steps are performed to pattern the sacrificial dielectric material layer and the dielectric capping layer such that a patterned dielectric capping layer is provided with a tapered sidewall. After removing the sacrificial dielectric material layer, a magnetic material-containing stack is formed within the opening in the patterned dielectric capping layer and atop the patterned dielectric capping layer. A planarization process is then employed to pattern the magnetic-containing stack by removing the magnetic material-containing stack that is located atop the patterned dielectric capping layer.

The magnetic structures are formed without using an IBE. Thus, the redeposition of metallic residue that occurs using IBE is avoided in the present application. Magnetic structures formed in the above manner and without using an IBE are free of redeposited metallic residue and have improved properties. For example, MTJ-containing structures that are formed in the above manner and without using an IBE, do not exhibit shorting that is caused by redeposited metallic residue. Also, magnetic inductors formed in the above manner and without using an IBE, have an improved quality factor, Q as compared to equivalent inductor that is formed by using an IBE.

In one aspect of the present application, a magnetic structure having tapered edges is provided. In one embodiment, the magnetic structure includes a dielectric material layer located on a lower interconnect level. A magnetic inductor having a tapered sidewall is embedded in a dielectric capping material structure that is located on the dielectric material layer. In accordance with the present application, the magnetic inductor has a topmost surface that is coplanar with a topmost surface of the dielectric capping material structure.

In another embodiment, the magnetic structure includes a lower interconnect level including an electrically conductive structure embedded in an interconnect dielectric material layer. A bottom electrode is located on a surface of the electrically conductive structure. A MTJ-containing structure having a tapered sidewall is embedded in a dielectric capping material structure that is located on the lower interconnect level. In accordance with the present application, the MTJ-containing structure contacts the bottom electrode and has a topmost surface that is coplanar with a topmost surface of the dielectric capping material structure. An upper interconnect level is located above the dielectric capping material structure and the MTJ-containing structure.

In another aspect of the present application, a method of forming a magnetic structure having tapered edges is provided without the use of ion beam etching. In one embodiment, the method includes forming a structure that includes a dielectric material layer located on a lower interconnect level, a dielectric capping layer located on the dielectric material layer, and a sacrificial dielectric material layer located on the dielectric capping layer. A first patterning step is performed to provide a first opening in the sacrificial dielectric material layer that physically exposes a portion of the dielectric capping layer, wherein the first opening has a first critical dimension and is laterally surrounded by a first remaining portion of the sacrificial dielectric material layer that has a vertical sidewall relative to a horizontal surface of the interconnect level. A second patterning step is thereafter performed to convert the first opening into a second opening having a second critical dimension that is greater than the first critical dimension, wherein the second opening extends entirely through both the first remaining portion of the sacrificial dielectric material layer and the dielectric capping layer to physically expose a portion of the dielectric material layer, wherein an upper portion of the second opening is laterally surrounded by a second remaining portion of the sacrificial dielectric material layer that has a vertical sidewall relative to a horizontal surface of the interconnect level, and a lower portion of the second opening is laterally surrounded by a remaining portion of the dielectric capping layer that has a tapered sidewall. Next, the second remaining portion of the sacrificial dielectric material layer is removed. An inductor material stack is then formed on the remaining portion of the dielectric capping layer and within an area defined by the lower portion of the second opening that is laterally surrounded by the remaining portion of the dielectric capping layer that has the tapered sidewall. A second dielectric material layer is thereafter formed on the material stack. A planarization process is then performed which removes the entirety of the second dielectric material layer, a portion of the inductor material stack and an upper portion of the remaining portion of the dielectric capping layer to provide a magnetic inductor having a tapered sidewall which is embedded in a dielectric capping material structure, wherein the magnetic inductor has a topmost surface that is coplanar with a topmost surface of the dielectric capping material structure.

In another embodiment, the method includes forming a bottom electrode on a surface of an electrically conductive structure that is embedded in a first interconnect dielectric material layer of a lower interconnect level. Next, a dielectric capping layer is formed on the lower interconnect level and the bottom electrode, and a sacrificial dielectric material layer is formed on the dielectric capping layer. A first patterning step is then performed to provide a first opening in the sacrificial dielectric material layer that physically exposes a portion of the dielectric capping layer, wherein the first opening has a first critical dimension and is laterally surrounded by a first remaining portion of the sacrificial dielectric material layer that has a vertical sidewall relative to a horizontal surface of the interconnect level. A second patterning step is thereafter performed to convert the first opening into a second opening having a second critical dimension that is greater than the first critical dimension, wherein the second opening extends entirely through both the first remaining portion of the sacrificial dielectric material layer and the dielectric capping layer to physically expose a portion of the bottom electrode, wherein an upper portion of the second opening is laterally surrounded by a second remaining portion of the sacrificial dielectric material layer that has a vertical sidewall relative to a horizontal surface of the interconnect level, and a lower portion of the second opening is laterally surrounded by a remaining portion of the dielectric capping layer that has a tapered sidewall. The second remaining portion of the sacrificial dielectric material layer is then removed, and thereafter, a magnetic tunnel junction (MTJ) material stack and a top electrode layer are formed on the remaining portion of the dielectric capping layer and within an area defined by the lower portion of the second opening that is laterally surrounded by the remaining portion of the dielectric capping layer that has the tapered sidewall. A planarization process is then performed which removes a portion of the top electrode layer, a portion of MTJ material stack and an upper portion of the remaining portion of the dielectric capping layer to provide a MTJ-containing structure having a tapered sidewall which is embedded in a dielectric capping material structure, wherein the MTJ-containing structure has a topmost surface that is coplanar with a topmost surface of the dielectric capping material structure.

DETAILED DESCRIPTION

Figure 1:
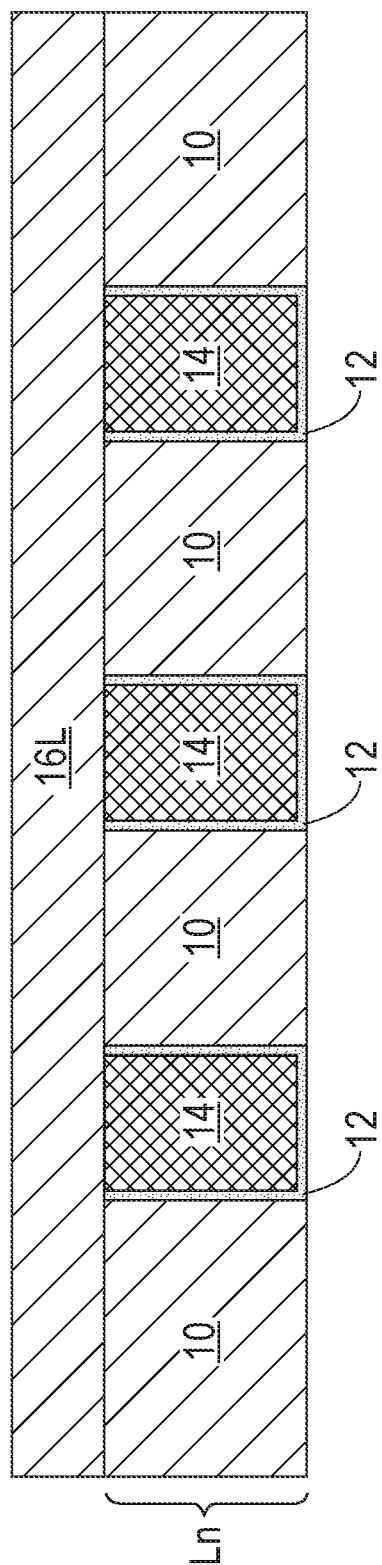
FIG. 1 is a cross sectional view of an exemplary structure that can be employed in accordance with an embodiment of the present application, wherein the exemplary structure includes a dielectric material layer located on a lower interconnect level that includes electrically conductive structures embedded in a first interconnect dielectric material layer.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

It is noted that the drawings of the present application illustrate a device area in which a magnetic structure such as, for example, a magnetic inductor or a MRAM, will be formed. A non-magnetic device area may be located laterally adjacent to the magnetic device area illustrated in the drawings of the present application.

Referring now to FIGS. 1-9, there are illustrated an embodiment of the present application for forming a magnetic inductor that has a tapered sidewall which is formed without using an ion beam etch (IBE). The magnetic inductor is embedded in a dielectric capping structure that laterally surrounds the magnetic inductor. The magnetic inductor and the dielectric capping structure are located on a dielectric material layer that is present on a lower interconnect level. An upper interconnect level is present above the magnetic inductor and the dielectric capping structure.

Referring first to FIG. 1, there is illustrated an exemplary structure that can be employed in accordance with an embodiment of the present application, wherein the exemplary structure includes a dielectric material layer 16L located on a lower interconnect level, $L_n$. The lower interconnect level, $L_n$, includes electrically conductive structures 14 embedded in a first interconnect dielectric material layer 10. Although the present application describes and illustrates the presence of a plurality of electrically conductive structures 14 embedded in the first interconnect dielectric material layer 10, the present application can be used when only a single electrically conductive structure 14 is embedded in the first interconnect dielectric material layer 10.

Although not illustrated in the drawings, a metal level can be located beneath the lower interconnect level, $L_n$. In some embodiments, and when n is 1, the metal level is a middle-of-the-line (MOL) level. In other embodiments, and when n is 2, 3, 4, etc, the metal level is an interconnect level that is positioned beneath lower interconnect level, $L_n$. In either embodiment, the metal level includes a dielectric material layer that contains at least one metal level electrically conductive structure embedded therein that is connected, either directly or indirectly, to an underlying CMOS device (not shown) that is present in a front-end-of-the-line (FEOL) level (also not shown).

When n is 1, the dielectric material layer of the metal level can be composed of a MOL dielectric material such as, for example, silicon dioxide, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than 4.0 (all dielectric constants expressed herein are measured in a vacuum). Also, and in such an embodiment (i.e., when n is 1), the at least one metal level electrically conductive structure is a contact structure that includes a contact metal or a contact metal alloy such as, for example, tungsten (W), cobalt (Co), platinum (Pt), nickel (Ni) or alloys thereof.

When n is greater than 1, the dielectric material layer of the metal level can be composed of an interconnect dielectric material such as, for example, silicon dioxide, silsesquioxanes, C doped oxides (i.e., organosilicates) that includes atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like. Also, and in such an embodiment (i.e., when n is greater than 1), the at least one metal level electrically conductive structure is composed of an electrically conductive metal or an electrically conductive metal alloy. Examples of electrically conductive materials that can be used in the present application include copper (Cu), aluminum (Al), or tungsten (W), while an example of an electrically conductive metal alloy is a Cu—Al alloy.

The first interconnect dielectric material layer 10 of lower interconnect level, $L_n$, can be composed of one of the interconnect dielectric materials mentioned above for the dielectric material layer of the metal level. The electrically conductive structures 14 that are embedded in the first interconnect dielectric material layer 10 can be composed of one of the electrically conductive metals or metal alloys mentioned above for the at least one metal level electrically conductive structure.

In some embodiments, a diffusion barrier liner 12 is formed along the sidewall and a bottom wall of the electrically conductive structure 14. In some embodiments (not illustrated), no diffusion barrier liner is present. The diffusion barrier liner 12 is composed of a diffusion barrier material (i.e., a material that serves as a barrier to prevent a conductive material such as copper from diffusing there through). Examples of diffusion barrier materials that can be used in providing the diffusion barrier liner 12 include, but are not limited to, Ta, TaN, Ti, TiN, Ru, RuN, RuTa, RuTaN, W, or WN. In some embodiments, the diffusion barrier material can include a material stack of diffusion barrier materials. In one example, the diffusion barrier material can be composed of a stack of Ta/TaN.

The metal level and the lower interconnect level, $L_n$, can be formed utilizing conventional processes that are well-known to those skilled in the art. So as to not obscure the method of the present application, the techniques used to form the metal level and lower interconnect level, $L_n$, are not provided herein. In one embodiment, a damascene process can be used in forming both the metal level and lower interconnect level, $L_n$. A damascene process can include forming an opening into a dielectric material, filling the opening with either a contact-metal containing material or an electrically conductive metal-containing material and, if needed, performing a planarization process such as, for example, chemical mechanical polishing (CMP) and/or grinding. In some embodiments, each electrically conductive structure 14 has a topmost surface that is coplanar with a topmost surface of the first interconnect dielectric material layer 10. Also, and in some embodiments, each diffusion barrier liner 12 has a topmost surface that is coplanar with the topmost surface of each electrically conductive structure 14 and the first interconnect dielectric material layer 10.

In one embodiment, the dielectric material layer 16L may be composed of one of the interconnect dielectric materials mentioned above. In such an embodiment, the interconnect dielectric material that provides the dielectric material layer 16L may be compositionally the same as, or compositionally different from, the interconnect dielectric material that provides the first interconnect dielectric material layer 10.

In another embodiment, the dielectric material layer 16L is composed of a dielectric capping material such as, for example, SiC, $Si_3N_4$, $SiO_2$, a carbon doped oxide, a nitrogen and hydrogen doped silicon carbide SiC(N,H) or multilayers thereof. The dielectric capping material that can provide the dielectric material layer 16L is compositionally different from the first interconnect dielectric material layer 10.

The dielectric material layer 16L can be formed utilizing a conventional deposition process such as, for example, spin-on coating, chemical vapor deposition (CVD), plasma enhanced chemical vapor deposition (PECVD), chemical solution deposition, evaporation, or plasma enhanced atomic layer deposition (PEALD). The dielectric material layer 16L is a continuous layer that is formed on the entirety of the lower interconnect level, $L_n$. The dielectric material layer 16L can have a thickness from 50 nm to 250 nm; although other thicknesses are contemplated and can be used as the thickness of the dielectric material layer 16L.

Figure 2:
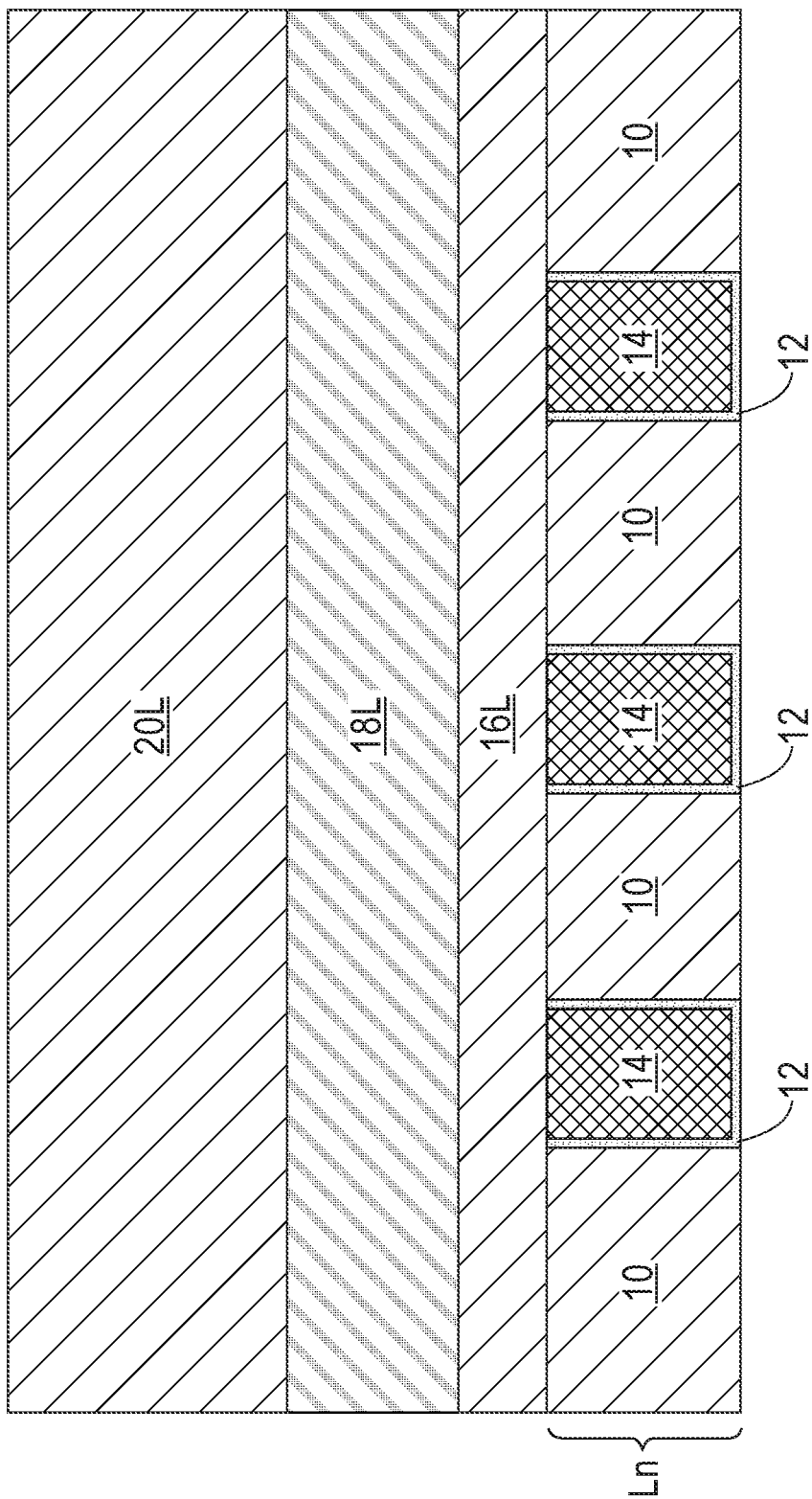
FIG. 2 is a cross sectional view of the exemplary structure of FIG. 1 after forming a dielectric capping layer on the dielectric material layer, and forming a sacrificial dielectric material layer on the dielectric capping layer.

Referring now to FIG. 2, there is illustrated the exemplary structure of FIG. 1 after forming a dielectric capping layer 18L on the dielectric material layer 16L, and forming a sacrificial dielectric material layer 20L on the dielectric capping layer 18L. Collectively, the dielectric capping layer 18L and the sacrificial dielectric material layer 20L can be referred to a dielectric material stack. The dielectric capping layer 18L is a continuous layer that is formed on an entirety of the dielectric material layer 16L, and the sacrificial dielectric material layer 20L is a continuous layer that is formed on an entirety of the dielectric capping layer 18L.

The dielectric capping layer 18L is composed of a dielectric capping material such as, for example, SiC, $Si_3N_4$, $SiO_2$, a carbon doped oxide, a nitrogen and hydrogen doped silicon carbide SiC(N,H) or multilayers thereof. The dielectric capping material that provides the dielectric capping layer 18L is compositionally different from dielectric material that provides the dielectric material layer 16L such that the dielectric material layer 16L serves as an etch stop layer. The dielectric capping material that provides the dielectric capping layer 18L has a dielectric constant which is greater than the ultra-low dielectric constant of the dielectric material that provides the sacrificial dielectric material layer 20L. The dielectric capping layer 18L can be formed utilizing a conventional deposition process such as, for example, chemical vapor deposition (CVD), plasma enhanced chemical vapor deposition (PECVD), chemical solution deposition, evaporation, or plasma enhanced atomic layer deposition (PEALD). The dielectric capping layer 18L can have a thickness from 100 nm to 500 nm; although other thicknesses are contemplated and can be used as the thickness of the dielectric capping layer 18L.

The sacrificial dielectric material layer 20L is composed of a dielectric material that has an ultra-low dielectric constant and is compositionally different from the dielectric capping layer 18L. By "ultra-low dielectric constant" it is meant a dielectric constant of less than 2.8. The dielectric material that provides the sacrificial dielectric material layer 20 can be porous or non-porous. In one example, the sacrificial dielectric material layer 20L is composed of a porous dielectric material that contains atoms of Si, C, O and H (i.e., a SiCOH dielectric material). Other dielectric materials that have an ultra-low dielectric constant which can be used as the sacrificial dielectric material layer 20L include, but are not limited to, spin-on organic polymers, or porous organosilicates. The sacrificial dielectric material layer 20L can be formed by a conventional deposition process such as, for example, spin-on coating, chemical vapor deposition (CVD), plasma enhanced chemical vapor deposition (PECVD), chemical solution deposition, evaporation, or plasma enhanced atomic layer deposition (PEALD). The sacrificial dielectric material layer 20L can have a thickness from 150 nm to 1000 nm; although other thicknesses are contemplated and can be used as the thickness of the sacrificial dielectric material layer 20L.

Figure 3:
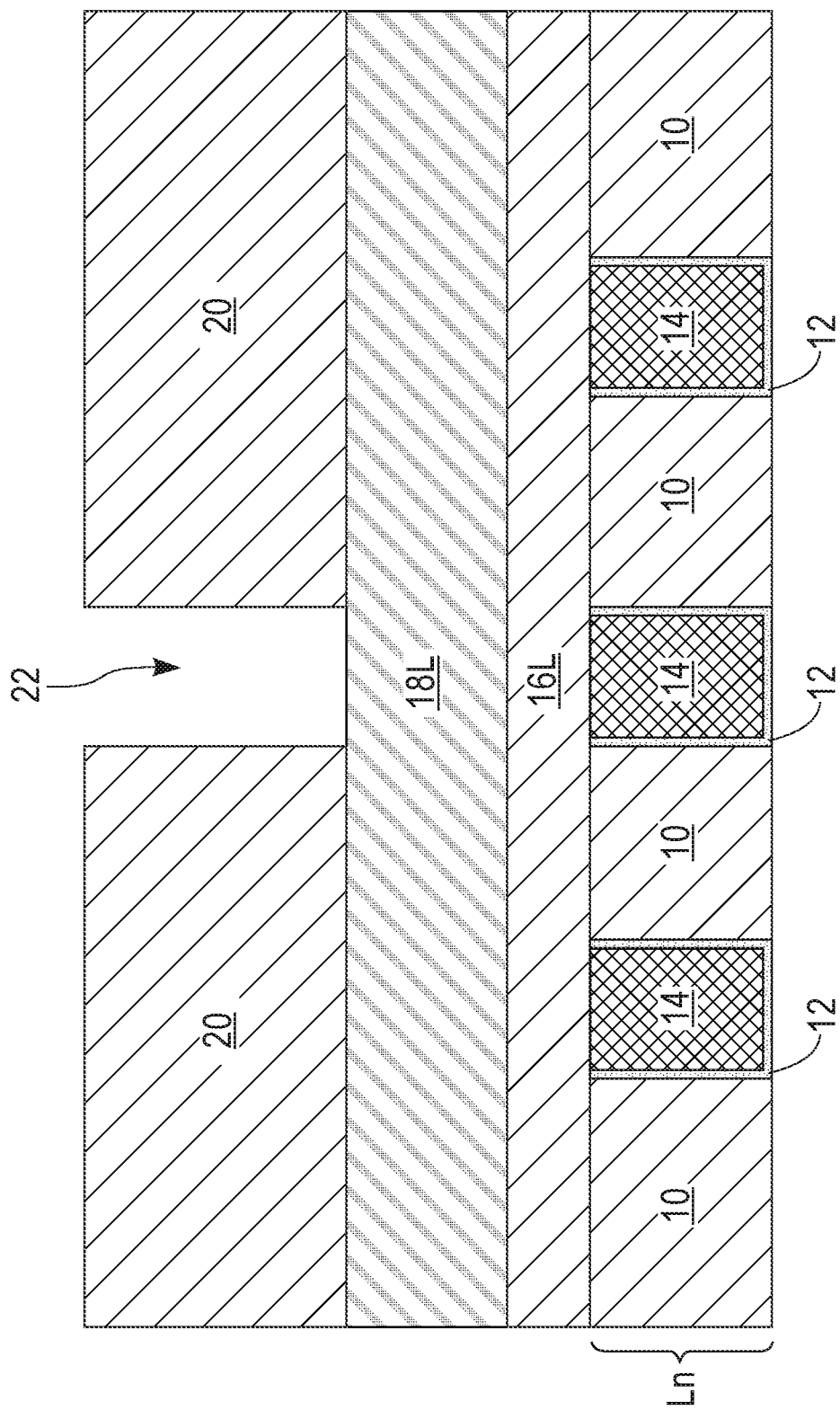
FIG. 3 is a cross sectional view of the exemplary structure of FIG. 2 after performing a first patterning step to provide a first opening in the sacrificial dielectric material layer that physically exposes a portion of the dielectric capping layer, wherein the first opening has a first critical dimension and is laterally surrounded by a first remaining portion of the sacrificial dielectric material layer that has a vertical sidewall relative to a horizontal surface of the interconnect level.

Referring now to FIG. 3, there is illustrated the exemplary structure of FIG. 2 after performing a first patterning step to provide a first opening 22 in the sacrificial dielectric material layer 20L that physically exposes a portion of the dielectric capping layer 18L, wherein the first opening 22 has a first critical dimension and is laterally surrounded by a first remaining portion of the sacrificial dielectric material layer (hereinafter first sacrificial dielectric material portion 20) that has a vertical sidewall relative to a horizontal surface of the interconnect level, $L_n$. In one embodiment, the first opening 22 is a via opening, and the first critical dimension, CD, is from 10 nm to 1000 nm.

The first patterning step includes lithography and etching. Lithography includes forming a photoresist material on a material or material stack that needs to be patterned, exposing the photoresist material to a desired pattern of irradiation, and developing the exposed photoresist material. The etch that provides first opening 22 into the sacrificial dielectric material layer 20L can be any anisotropic etch such as, for example, a reactive ion etch (RIE). The patterned photoresist is removed after the first patterning step utilizing a conventional resist removal process such as, for example, stripping or ashing, providing the structure shown in FIG. 3.

It should be noted that although the present application describes and illustrates the formation of a single first opening 22 into the sacrificial dielectric material layer 20L, a plurality of spaced apart first openings 22 can be formed into the sacrificial dielectric material layer 20L.

Figure 4:
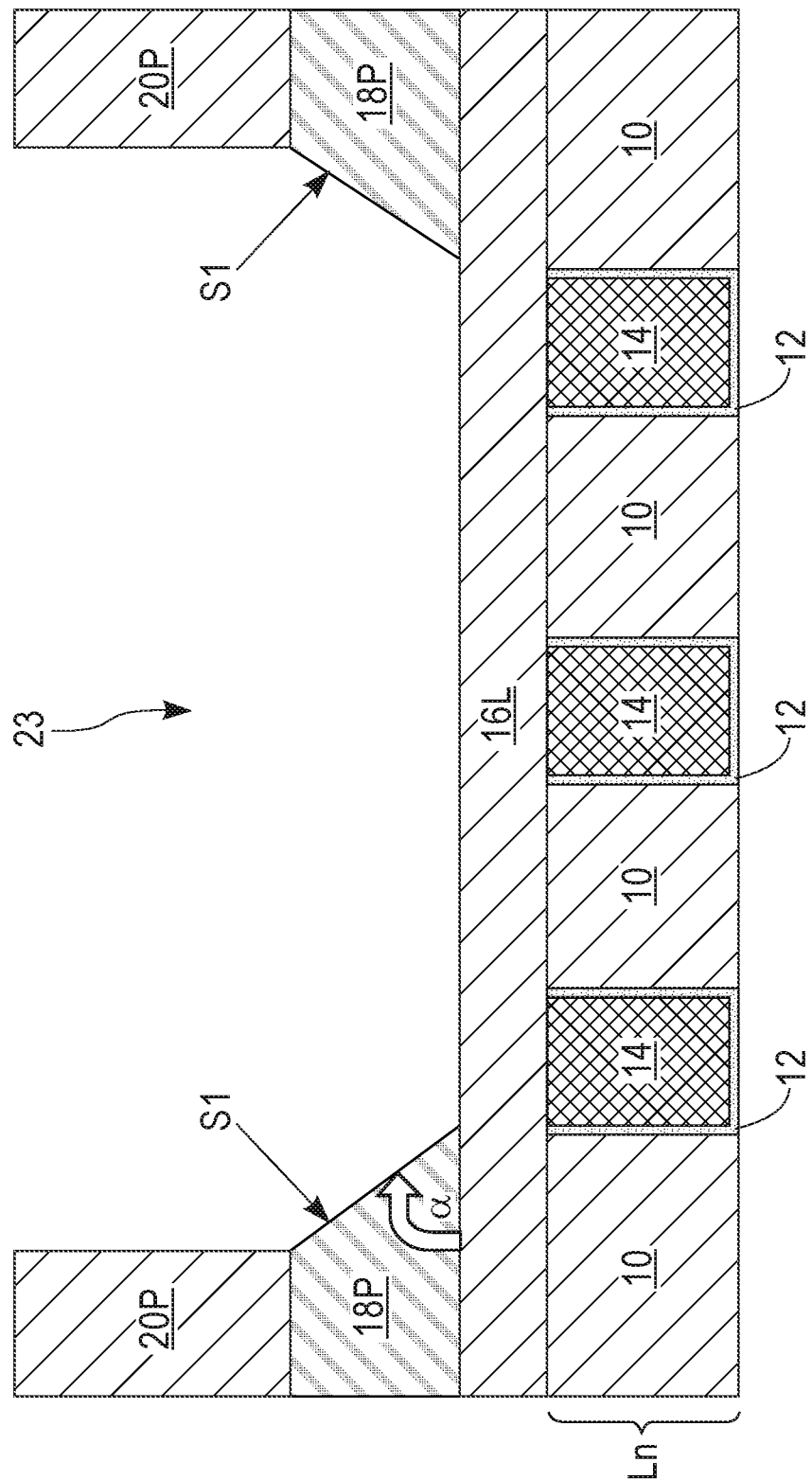
FIG. 4 is a cross sectional view of the exemplary structure of FIG. 3 after performing a second patterning step to convert the first opening into a second opening having a second critical dimension that is greater than the first critical dimension, wherein the second opening extends entirely through both the first remaining portion of the sacrificial dielectric material layer and the dielectric capping layer to physically expose a portion of the dielectric material layer, wherein an upper portion of the second opening is laterally surrounded by a second remaining portion of the sacrificial dielectric material layer that has a vertical sidewall relative to a horizontal surface of the interconnect level, and a lower portion of the second opening is laterally surrounded by a remaining portion of the dielectric capping layer that has a tapered sidewall.

Referring now to FIG. 4, there is illustrated the exemplary structure of FIG. 3 after performing a second patterning step to convert the first opening 22 into a second opening 23 having a second critical dimension that is greater than the first critical dimension, wherein the second opening 23 extends entirely through both the first remaining portion of the sacrificial dielectric material layer (i.e., the first sacrificial dielectric material portion 20) and the dielectric capping layer 18L to physically expose a portion of the dielectric material layer 16L, wherein an upper portion of the second opening 23 is laterally surrounded by a second remaining portion of the sacrificial dielectric material layer (hereinafter second sacrificial dielectric material portion 20P) that has a vertical sidewall relative to a horizontal surface of the interconnect level, $L_n$, and a lower portion of the second opening 23 is laterally surrounded by a remaining portion of the dielectric capping layer (hereinafter dielectric capping material portion 18P) that has a tapered sidewall, S1.

In one embodiment of the present application, the second critical dimension of the second opening 23 is from 100 nm to 5000 nm. As is shown in FIG. 4, the upper portion of the second opening 23 that is laterally surrounding by the second sacrificial material portion 20P has a constant width, while the width of lower portion of the second opening 23 decreases from the topmost surface of the dielectric capping material portion 18P to the bottommost surface of the dielectric capping material portion 18P.

The second patterning step includes lithography, as defined above, and etching. The etch used in the second patterning step is typically a reactive ion etch. Due to the difference in the dielectric constants of the sacrificial dielectric material layer 20L and the dielectric capping layer 18L, the etch that is employed in this step of the present application provides a tapered sidewall S1, to the dielectric capping material portion 18P that laterally surrounds the lower portion of the second opening 23. In accordance with the present application, the angle, $\alpha$, as measured from the bottommost surface of the dielectric capping material portion 18P to the slope sidewall, S1, is from 30° to 70°.

Figure 5:
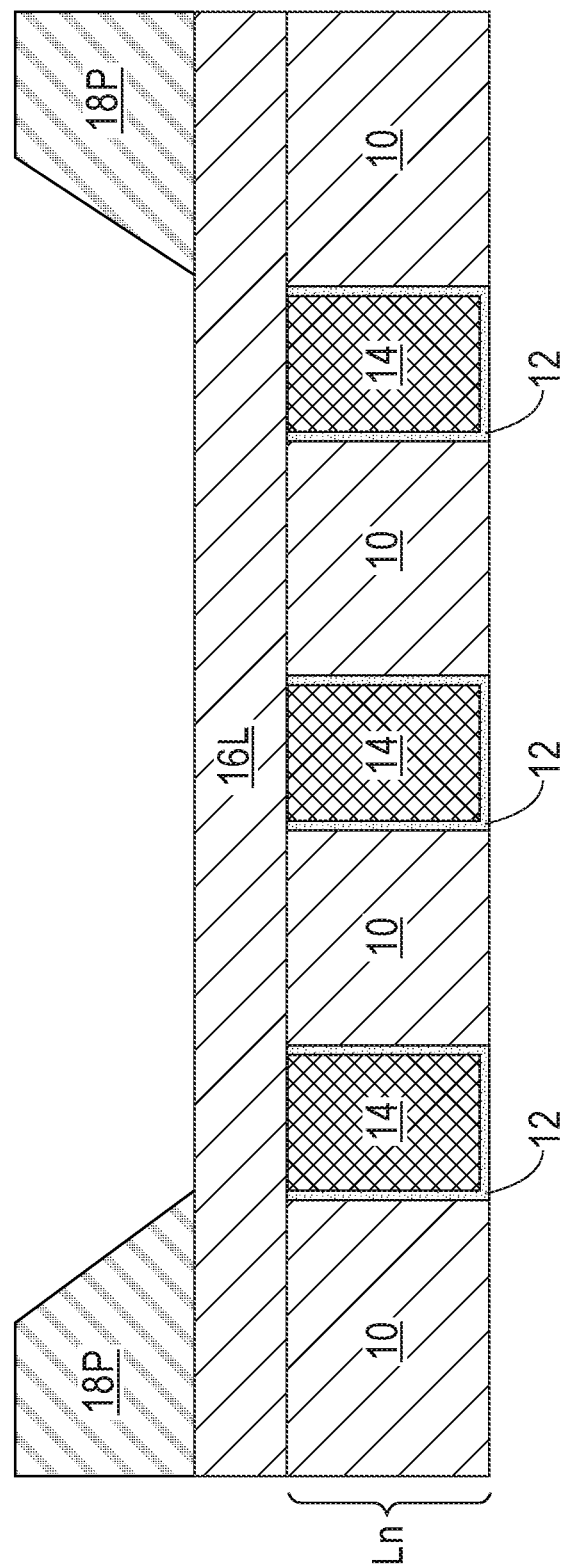
FIG. 5 is a cross sectional view of the exemplary structure of FIG. 4 after removing the second remaining portion of the sacrificial dielectric material layer.

Referring now to FIG. 5, there is illustrated the exemplary structure of FIG. 4 after removing the second remaining portion of the sacrificial dielectric material layer (i.e., the second sacrificial dielectric material portion 20P). The second remaining portion of the sacrificial dielectric material layer (i.e., the second sacrificial dielectric material portion 20P) can be removed utilizing any material removal process such as, for example, planarization or etching. In one embodiment, the second remaining portion of the sacrificial dielectric material layer (i.e., the second sacrificial dielectric material portion 20P) is removed utilizing a reactive ion etch. After the removal of the second remaining portion of the sacrificial dielectric material layer (i.e., the second sacrificial dielectric material portion 20P), the remaining portion of the dielectric capping layer (i.e., the dielectric capping material portion 18P having the tapered sidewall, S1, remains.

Figure 6:
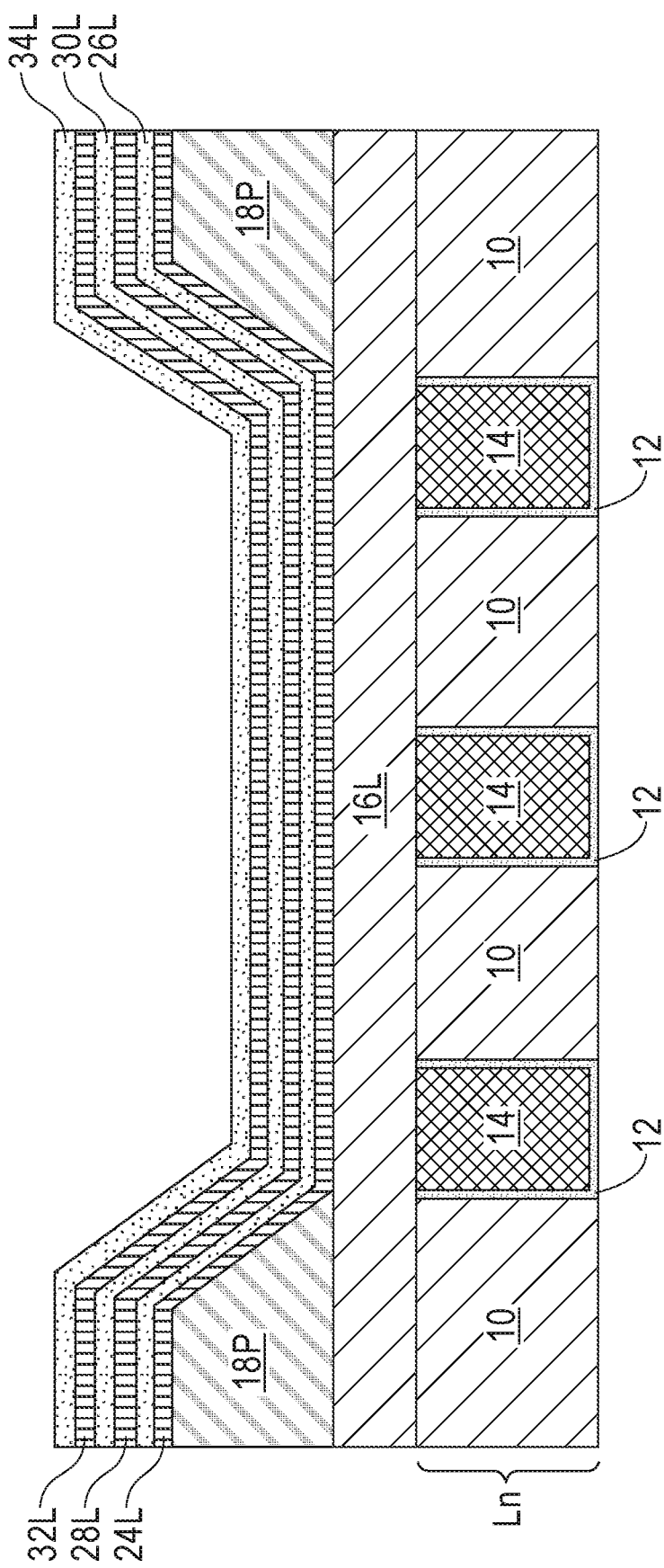
FIG. 6 is a cross sectional view of the exemplary structure of FIG. 5 after forming a magnetic inductor material stack of alternating layers of a dielectric material and a magnetic material on the remaining portion of the dielectric capping layer and within an area defined by the lower portion of the second opening that is laterally surrounded by the remaining portion of the dielectric capping layer that has the tapered sidewall.

Referring now to FIG. 6, there is illustrated the exemplary structure of FIG. 5 after forming an inductor material stack of alternating layers of a dielectric material and a magnetic material on the remaining portion of the dielectric capping layer (i.e., the dielectric capping material portion 18P) and within an area defined by the lower portion of the second opening 23 that is laterally surrounded by the remaining portion of the dielectric capping layer (i.e., the dielectric capping material portion 18P) that has the tapered sidewall, S1. The area defined by the lower portion of the second opening 23, which is laterally surrounded by a remaining portion of the dielectric capping layer (hereinafter dielectric capping material portion 18P) that has tapered sidewall, S1, can be circular or elliptical in shape. Thus, a magnetic inductor that is conical in shape can be formed.

The number of dielectric material layers and the number of magnetic material layers within the inductor material stack may vary so long as at least one dielectric material layer and at least one magnetic material layer is formed. By way of illustration only, FIG. 6 shows three dielectric material layers 24L, 28L and 32L and three magnetic material layers 26L, 30L, and 34L.

Each dielectric material layer (e.g., dielectric material layers 24L, 28L and 32L) of the inductor material stack can be composed of a non-magnetic insulator material such as, for example, aluminum oxide, silicon dioxide, silicon nitride, silicon oxynitride, or magnesium oxide. Each dielectric material layer (e.g., dielectric material layers 24L, 28L and 32L) of the inductor material stack can be composed of a compositionally same non-magnetic insulator material, or a compositionally different non-magnetic insulator material. Alternatively, a first set of dielectric material layers of the inductor material stack can be composed of a first non-magnetic insulator material, and a second set of dielectric material layers of the inductor material stack can be composed of a second non-magnetic insulator material that is compositionally different from the first non-magnetic insulator material. Each dielectric material layer (e.g., dielectric material layers 24L, 28L and 32L) of the inductor material stack can be formed by a deposition process such as, for example, chemical vapor deposition (CVD), plasma enhanced chemical vapor deposition (PECVD) or physical vapor deposition (PVD). Each dielectric material layer (e.g., dielectric material layers 24L, 28L and 32L) of the inductor material stack can have a thickness in the range from 5 nm to 100 nm, although other thicknesses are within the scope of the present application.

Each magnetic material layers (e.g., magnetic material layers 26L, 30L and 34L) of the inductor material stack can be composed of a magnetic material known in the art, such as, for example, a ferromagnetic material, a soft magnetic material, an iron alloy, a nickel alloy, a cobalt alloy, a ferrite, or a plated material such as a permalloy. In some embodiments, each magnetic material layers (e.g., magnetic material layers 26L, 30L and 34L) of the inductor material stack can be composed a Co containing magnetic material, FeTaN, FeNi, or FeAlO.

Each magnetic material layers (e.g., magnetic material layers 26L, 30L and 34L) of the inductor material stack can be composed of a compositionally same magnetic material, or a compositionally different magnetic material. Alternatively, a first set of magnetic material layers of the inductor material stack can be composed of a first magnetic material, and a second set of magnetic material layers of the inductor material stack can be composed of a second magnetic material that is compositionally different from the first magnetic material. Each magnetic material layers (e.g., magnetic material layers 26L, 30L and 34L) of the inductor material stack can be formed by a deposition process such as, for example, chemical vapor deposition (CVD), plasma enhanced chemical vapor deposition (PECVD) or physical vapor deposition (PVD). Each magnetic material layers (e.g., magnetic material layers 26L, 30L and 34L) of the inductor material stack can have a thickness in the range from 1 nm to 25 nm, although other thicknesses are within the scope of the present application.

Figure 7:
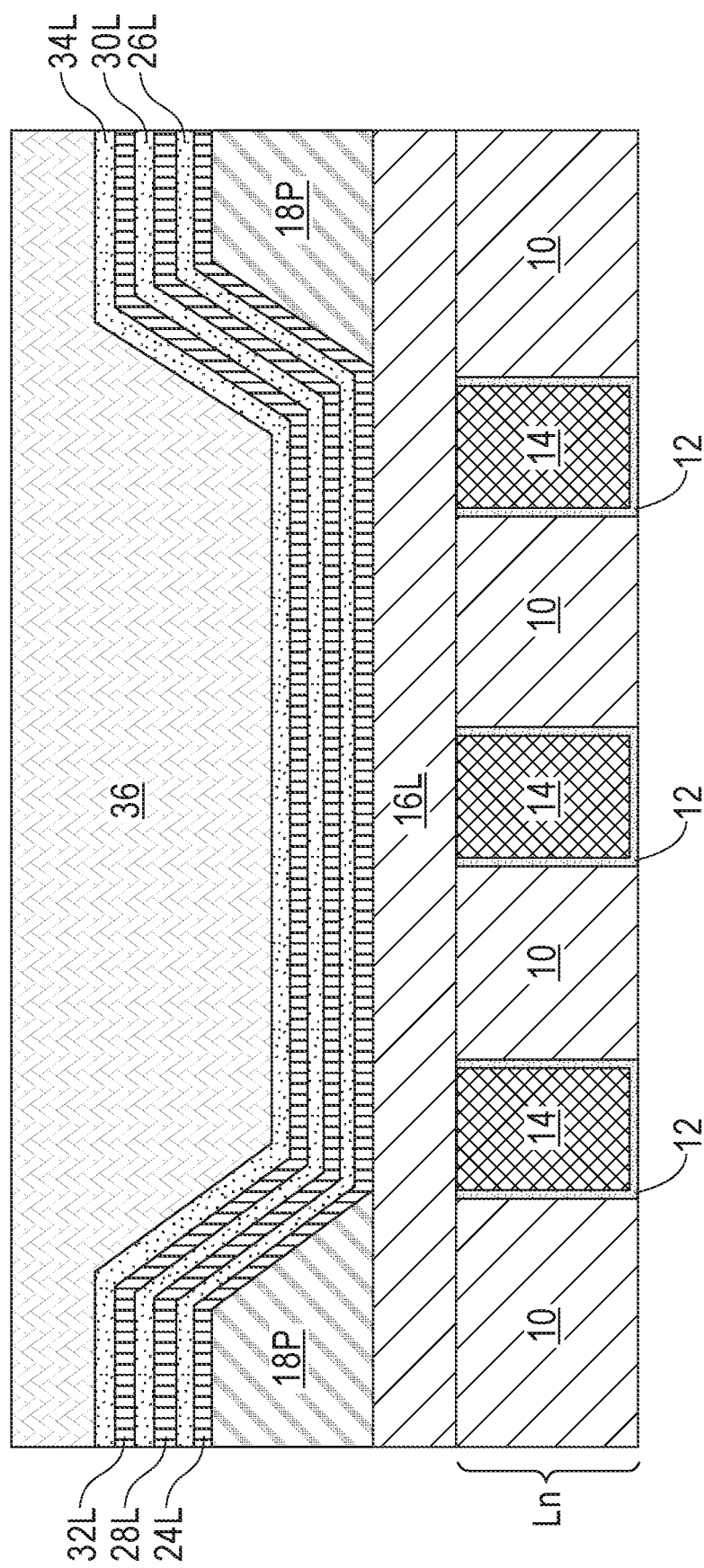
FIG. 7 is a cross sectional view of the exemplary structure of FIG. 6 after forming a second dielectric material layer on the inductor material stack.

Referring now to FIG. 7, there is illustrated the exemplary structure of FIG. 6 after forming a second dielectric material layer 36 on the inductor material stack. As is shown, a portion of the second dielectric material layer 36 extends into an upper portion of the area that is defined by the lower portion of the second opening 23. The second dielectric material layer 36 may be composed of any dielectric material including, for example, a spun-on dielectric material (i.e. a flowable oxide, or an organic polymer), or a CVD dielectric material (i.e., silicon oxide or SiCO). The second dielectric material layer 36 can be formed utilizing a deposition process including, for example, spin-on coating, chemical vapor deposition (CVD), or plasma enhanced chemical vapor deposition (PECVD). A planarization process may follow the deposition of the dielectric material that provides the second dielectric material layer 36.

Figure 8:
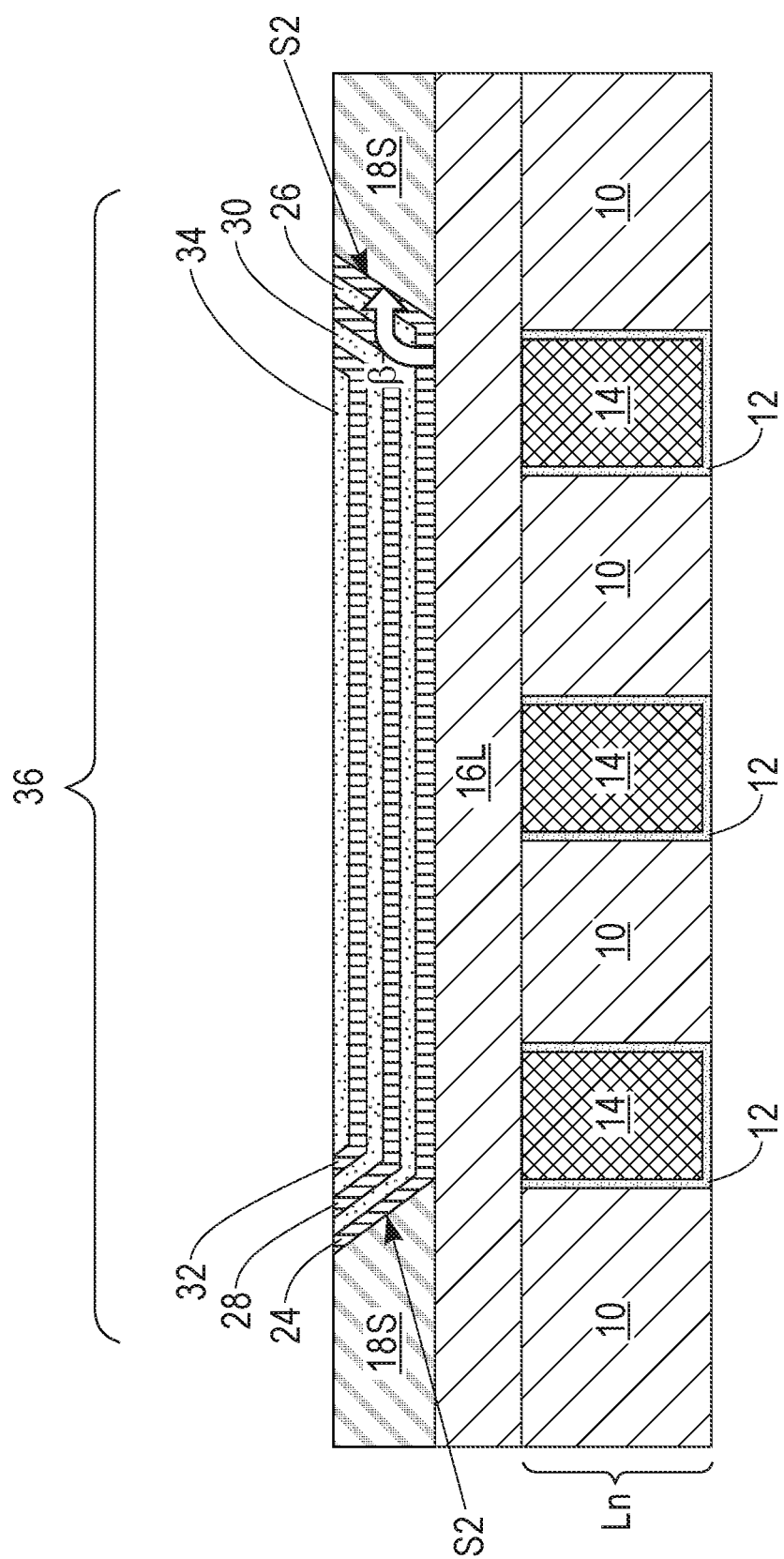
FIG. 8 is a cross sectional view of the exemplary structure of FIG. 7 after performing a planarization process which removes the entirety of the second dielectric material layer, a portion of the inductor material stack and an upper portion of the remaining portion of the dielectric capping layer to provide a magnetic inductor having a tapered sidewall which is embedded in a dielectric capping material structure, wherein the magnetic inductor has a topmost surface that is coplanar with a topmost surface of the dielectric capping material structure.

Referring now to FIG. 8, there is illustrated the exemplary structure of FIG. 7 after performing a planarization process which removes the entirety of the second dielectric material layer 36, a portion of the inductor material stack and an upper portion of the remaining portion of the dielectric capping layer (i.e., the dielectric material layer portion 18P) to provide a magnetic inductor 36 having a tapered sidewall, S2, which is embedded in a dielectric capping material structure 18S, wherein the magnetic inductor 36 has a topmost surface that is coplanar with a topmost surface of the dielectric capping material structure 18S. In accordance with the present application, the tapered sidewall, S2, of the magnetic inductor 36 slopes outward from a bottommost surface of the magnetic inductor 36 to the topmost surface of the magnetic inductor 38. In one embodiment, the tapered sidewall, S2, of the magnetic structure 36 has an angle, ß, as measured from the bottommost surface of the magnetic inductor 36 to the tapered sidewall, S2, that is from 30° to 70°. The planarization process may include chemical mechanical polishing and/or grinding.

The magnetic inductor 36 includes a non-removed portion of the magnetic inductor material stack that was in the area defined by the lower portion of the second opening 23. The magnetic inductor 36 thus includes non-removed portions of the alternating layers of dielectric material and magnetic material mentioned above. In FIG. 8 and by of illustration only, the magnetic inductor 36 includes three layers of dielectric material (24, 28, and 32) and three layers of magnetic material (26, 30, and 34). As is shown, each layer of dielectric material (24, 28, and 32) and each layer of magnetic material (26, 30, and 34) of the magnetic inductor 36 has a topmost surface that is coplanar with each other as well as being coplanar with the topmost surface of the dielectric capping material structure 18S.

The dielectric capping material structure 18S is composed of a second remaining portion of the dielectric capping material layer portion 18P mentioned above. The dielectric capping material structure 18S has a tapered sidewall that is equivalent to S1 mentioned above.

Figure 9:
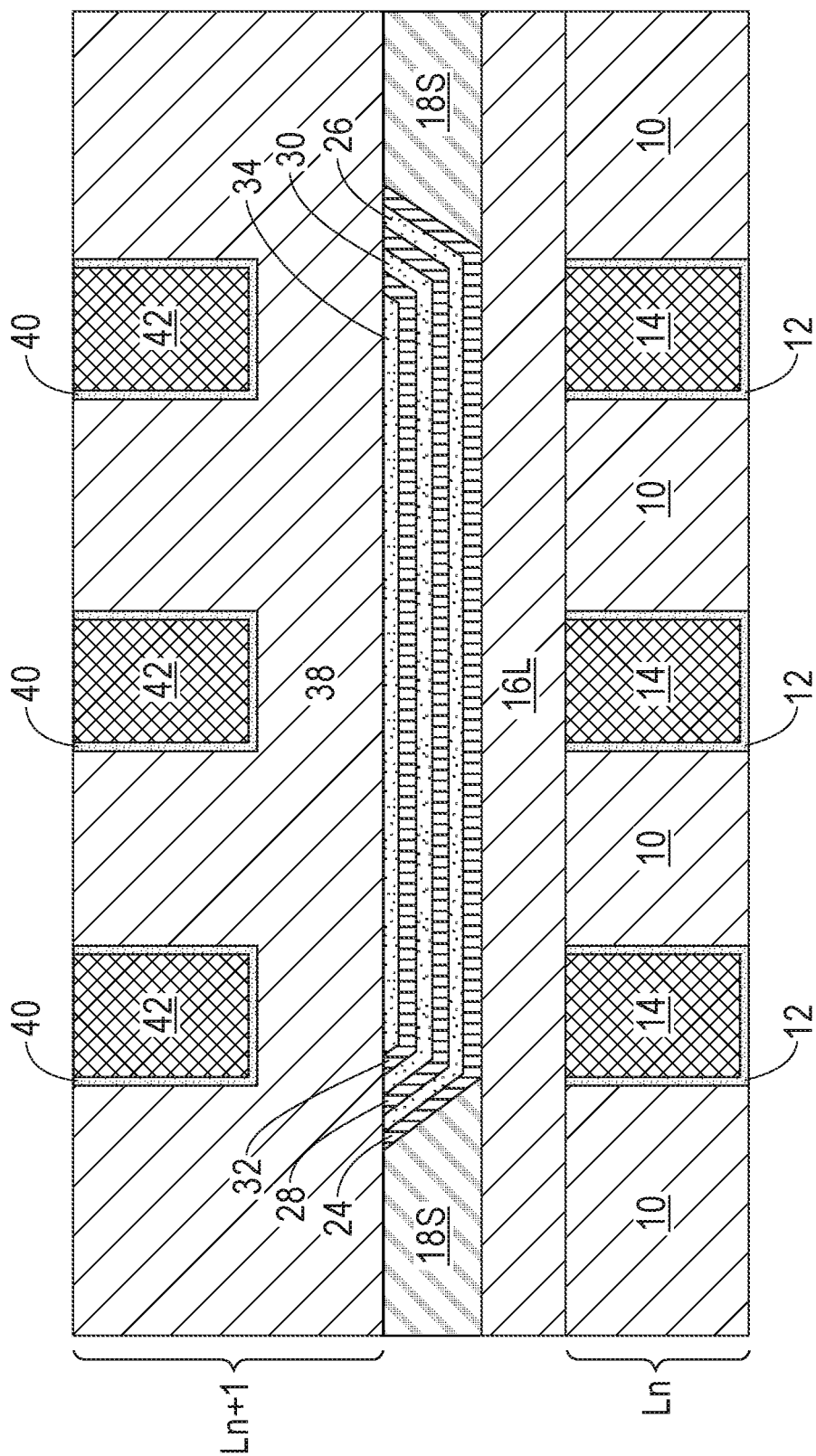
FIG. 9 is a cross sectional view of the exemplary structure of FIG. 8 after forming an upper interconnect level above the magnetic inductor and the remaining portion of the dielectric capping layer (i.e., the dielectric capping material structure).

Referring now to FIG. 9, there is illustrated the exemplary structure of FIG. 8 after forming an upper interconnect level, $L_{n+1}$, above the magnetic inductor 36 and the remaining portions of the dielectric capping layer (i.e., the dielectric capping material structure 18S). The upper interconnect level, $L_{n+1}$, includes at least one electrically conductive structure 42 embedded in a second interconnect dielectric material layer 38. The diffusion barrier liner 40 can be present along the sidewalls and bottom wall of each of the electrically conductor structures 42.

The second interconnect dielectric material layer 38 may include one of the interconnect dielectric materials mentioned above. The interconnect dielectric material may be compositionally the same as, or compositionally different from, the interconnect dielectric material that provides the first interconnect dielectric material layer 10. The diffusion barrier liner 40 is composed of one of the diffusion barrier materials mentioned above for diffusion barrier liner 12. The electrically conductive structure 42 can be composed of one of the electrically conductive materials mentioned above for electrically conductor structure 14. As is shown, the electrically conductive structures 42 that are embedded in the second interconnect dielectric material are spaced apart for the magnetic inductor 36. The upper interconnect level, $L_{n+1}$, can be formed utilizing techniques well known to those skilled in the art including the technique mentioned above for forming the lower interconnect level, $L_n$.

Referring now to FIGS. 10-18, there are illustrated an embodiment of the present application for forming a MTJ-containing structure that has a tapered sidewall which is formed without using an ion beam etch (IBE). The MTJ-containing structure which includes a MTJ pillar and a top electrode is embedded in a dielectric capping structure that laterally surrounds the MTJ-containing structure. The MTJ pillar of the MTJ-containing structure is located on a surface of a bottom electrode that is present on a surface of an electrically conductive structure that is present in an interconnect level of a lower interconnect level. An upper interconnect level is present above the MTJ-containing structure and the dielectric capping structure.

Figure 10:
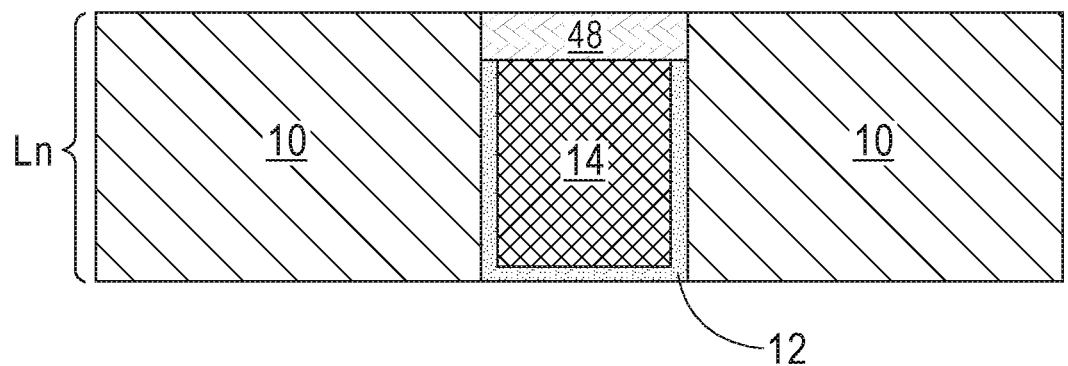
FIG. 10 is a cross sectional view of another exemplary structure that can be employed in accordance with another embodiment of the present application, wherein the another exemplary structure includes a lower interconnect level that includes at least one electrically conductive structure embedded in a first interconnect dielectric material layer, and a bottom electrode located on a surface of the at least one electrically conductive structure.

Referring first to FIG. 10, there is illustrated another exemplary structure that can be employed in accordance with another embodiment of the present application, wherein the another exemplary structure includes a lower interconnect level, $L_n$, that includes at least one electrically conductive structure 14 embedded in a first interconnect dielectric material layer 10, and a bottom electrode 48 located on a surface of the at least one electrically conductive structure 14. A diffusion barrier liner 12 may or may not be present along the sidewall and bottom wall of the at least one electrically conductive structure 12.

Although the present application describes and illustrates the presence of single electrically conductive structure 14 embedded in the first interconnect dielectric material layer 10, the present application can be used when a plurality of electrically conductive structure 14 is embedded in the first interconnect dielectric material layer 10. In such an embodiment, a bottom electrode 48 can be formed on each of the electrically conductive structures 14.

Although not illustrated in the drawings, a metal level can be located beneath the lower interconnect level, $L_n$. In some embodiments, and when n is 1, the metal level is a middle-of-the-line (MOL) level, as defined above In other embodiments, and when n is 2, 3, 4, etc, the metal level is an interconnect level that is positioned beneath lower interconnect level, $L_n$, as defined above In either embodiment, the metal level includes a dielectric material layer that contains at least one metal level electrically conductive structure embedded therein that is connected, either directly or indirectly, to an underlying CMOS device (not shown) that is present in a front-end-of-the-line (FEOL) level (also not shown).

The lower interconnect level, $L_n$, including the at least one electrically conductive structure 14 embedded in the first interconnect dielectric material layer 10 is the same as that mentioned above for the embodiment depicted in FIG. 1. Thus, the description provided above for the lower interconnect level, $L_n$, including the various materials for the first interconnect dielectric material layer 10, the electrically conductive structure 14 and the diffusion barrier liner 12 of FIG. 1 applied here for the lower interconnect level, $L_n$, depicted in FIG. 10.

Bottom electrode 48 can be composed of a conductive material such as, for example, Ta, TaN, Ti, TiN, Ru, RuN, RuTa, RuTaN, Co, CoWP, CoN, W, WN or any combination thereof. The bottom electrode 48 can be formed by a deposition process such as, for example, sputtering, chemical vapor deposition (CVD), or plasma enhanced chemical vapor deposition (PECVD). In some embodiments and as shown in FIG. 10, the bottom electrode 48 is formed by first recessing the electrically conductive structure 14 and, if present, the diffusion barrier liner 12, and thereafter the bottom electrode 48 is formed on the recessed surface of the electrically conductive structure 14 and, if present, the diffusion barrier liner 12. In such an embodiment, and following the deposition of the conductive material that provides the bottom electrode 48 a planarization process can be performed to form the structure shown in FIG. 10. In some instances, the bottom electrode 48 has a topmost surface that is coplanar with a topmost surface of the first interconnect dielectric material layer 10.

In another embodiment (not shown), the bottom electrode 48 is formed upon a non-recessed surface of the electrically conductive structure 14. In such an embodiment, the bottom electrode 48 is embedded in a dielectric capping material substrate. In such embodiment, the bottom electrode 48 has a bottommost surface that directly contacts the non-recessed surface of the electrically conductive structure 14, and a topmost surface that is coplanar with a topmost surface of the dielectric capping material substrate.

Figure 11:
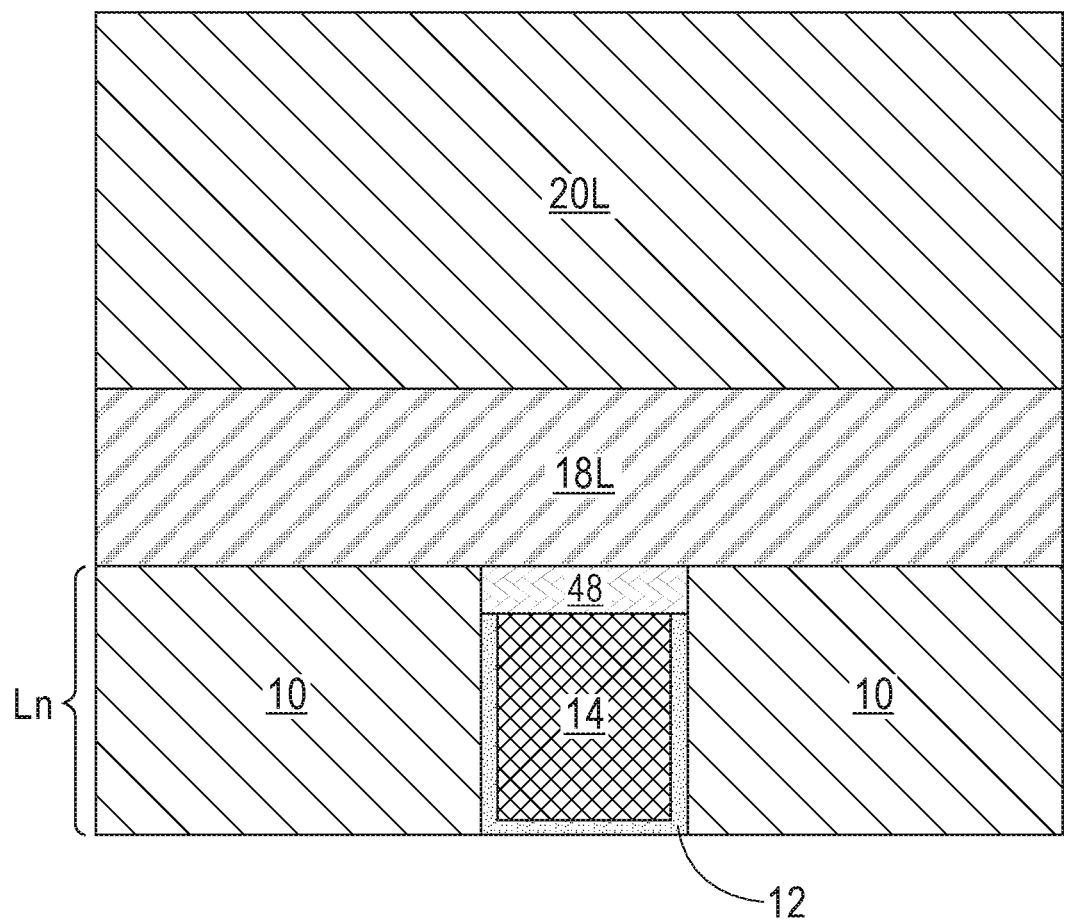
FIG. 11 is a cross sectional view of the exemplary structure of FIG. 10 after forming a dielectric capping layer on the lower interconnect level, and forming a sacrificial dielectric material layer on the dielectric capping layer.

Referring now to FIG. 11, there is illustrated the exemplary structure of FIG. 10 after forming a dielectric capping layer 18L on the lower interconnect level, $L_n$, and forming a sacrificial dielectric material layer 20L on the dielectric capping layer 18L. The dielectric capping layer 18L and the sacrificial dielectric material layer 20L that are employed in this embodiment of the present application are the same as the dielectric capping layer 18L and the sacrificial dielectric material layer 20L that are employed in the embodiment depicted in FIGS. 1-9. Thus, the description for the dielectric capping layer 18L and the description for the sacrificial dielectric material layer 20L mentioned above in regard to FIG. 2 are incorporated herein by reference.

Figure 12:
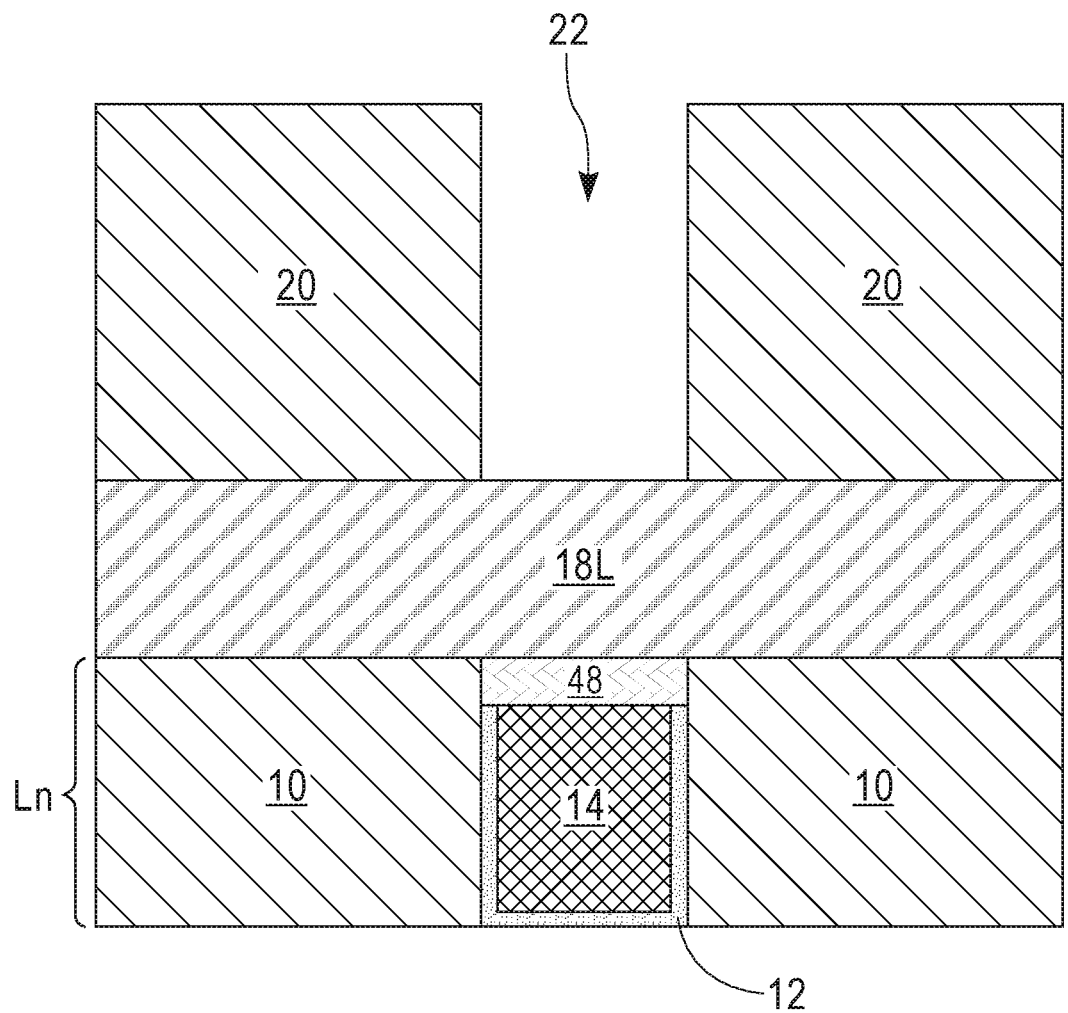
FIG. 12 is a cross sectional view of the exemplary structure of FIG. 11 after performing a first patterning step to provide a first opening in the sacrificial dielectric material layer that physically exposes a portion of the dielectric capping layer, wherein the first opening has a first critical dimension and is laterally surrounded by a first remaining portion of the sacrificial dielectric material layer that has a vertical sidewall relative to a horizontal surface of the interconnect level.

Referring now to FIG. 12, there is illustrated the exemplary structure of FIG. 11 after performing a first patterning step to provide a first opening 22 in the sacrificial dielectric material layer 20L that physically exposes a portion of the dielectric capping layer 18L, wherein the first opening 22 has a first critical dimension and is laterally surrounded by a remaining portion of the sacrificial dielectric material layer (i.e., first sacrificial dielectric material portion 20) that has a vertical sidewall relative to a horizontal surface of the interconnect level, $L_n$. The first patterning step used in this embodiment is the same as described above in the previous embodiment of the present application. The first critical dimension of the first opening 22 is within the range mentioned above in the previous embodiment of the present application.

Figure 13:
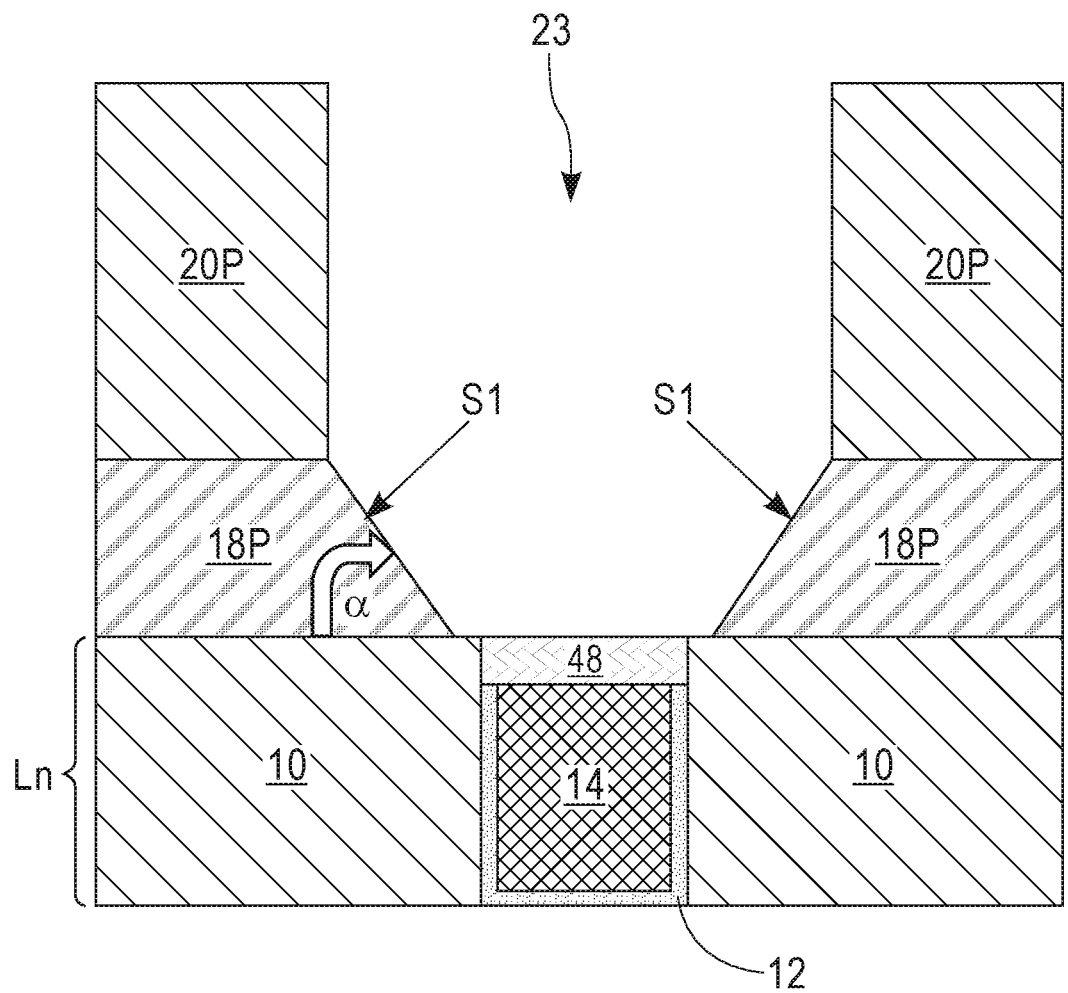
FIG. 13 is a cross sectional view of the exemplary structure of FIG. 12 after performing a second patterning step to convert the first opening into a second opening having a second critical dimension that is greater than the first critical dimension, wherein the second opening extends entirely through both the first remaining portion of the sacrificial dielectric material layer and the dielectric capping layer to physically expose a portion of the bottom electrode, wherein an upper portion of the second opening is laterally surrounded by a remaining portion of the sacrificial dielectric material layer that has a vertical sidewall relative to a horizontal surface of the interconnect level, and a lower portion of the second opening is laterally surrounded by a remaining portion of the dielectric capping layer that has a tapered sidewall.

Referring now to FIG. 13, there is illustrated the exemplary structure of FIG. 12 after performing a second patterning step to convert the first opening 22 into a second opening 23 having a second critical dimension that is greater than the first critical dimension, wherein the second opening 23 extends entirely through both the first remaining portion of the sacrificial dielectric material layer (i.e., first sacrificial dielectric material portion 20) and the dielectric capping layer 18L to physically expose a portion of the bottom electrode 48, wherein an upper portion of the second opening 23 is laterally surrounded by a remaining portion of the sacrificial dielectric material layer (i.e., second sacrificial dielectric material portion 20P) that has a vertical sidewall relative to a horizontal surface of the interconnect level, $L_n$, and a lower portion of the second opening 23 is laterally surrounded by a remaining portion of the dielectric capping layer (i.e., dielectric capping material portion 18P) that has a tapered sidewall, S1.

The second patterning step used in this embodiment is the same as described above in the previous embodiment of the present application. The second critical dimension of the second opening 23 is within the range mentioned above in the previous embodiment of the present application. In accordance with the present application, the angle, α, as measured from the bottommost surface of the dielectric capping material portion 18P to the slope sidewall, S1, is from 30° to 70°.

Figure 14:
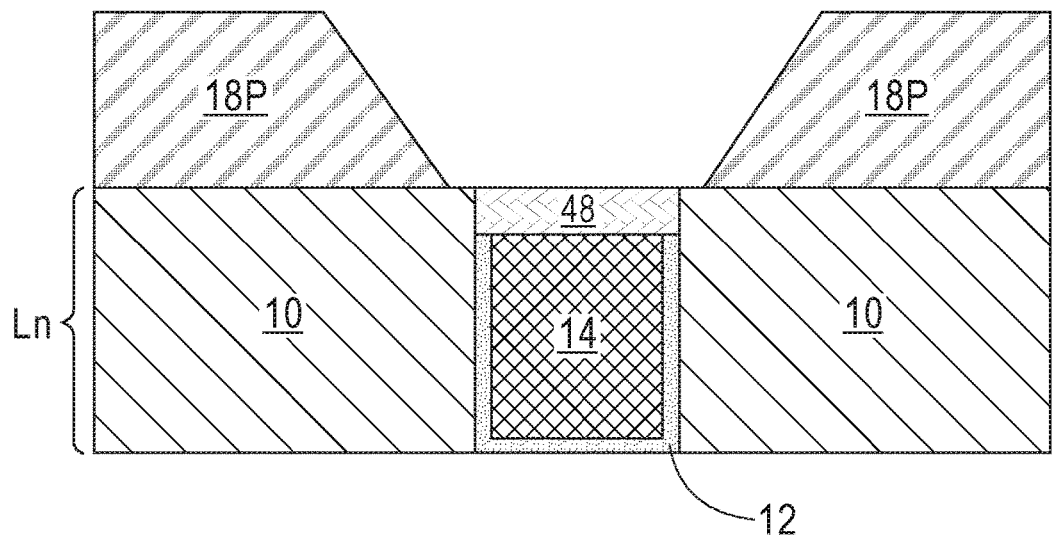
FIG. 14 is a cross sectional view of the exemplary structure of FIG. 13 after removing the second remaining portion of the sacrificial dielectric material layer.

Referring now to FIG. 14, there is illustrated the exemplary structure of FIG. 13 after removing the second remaining portion of the sacrificial dielectric material layer (i.e., the second sacrificial dielectric material portion 20P). The second remaining portion of the sacrificial dielectric material layer (i.e., the second sacrificial dielectric material portion 20P) can be removed utilizing any material removal process such as, for example, planarization or etching. In one embodiment, the second remaining portion of the sacrificial dielectric material layer (i.e., the second sacrificial dielectric material portion 20P) is removed utilizing a reactive ion etch. After the removal of the second remaining portion of the sacrificial dielectric material layer (i.e., the second sacrificial dielectric material portion 20P), the remaining portion of the dielectric capping layer (i.e., the dielectric capping material portion 18P) having the tapered sidewall, S1, remains.

Figure 15:
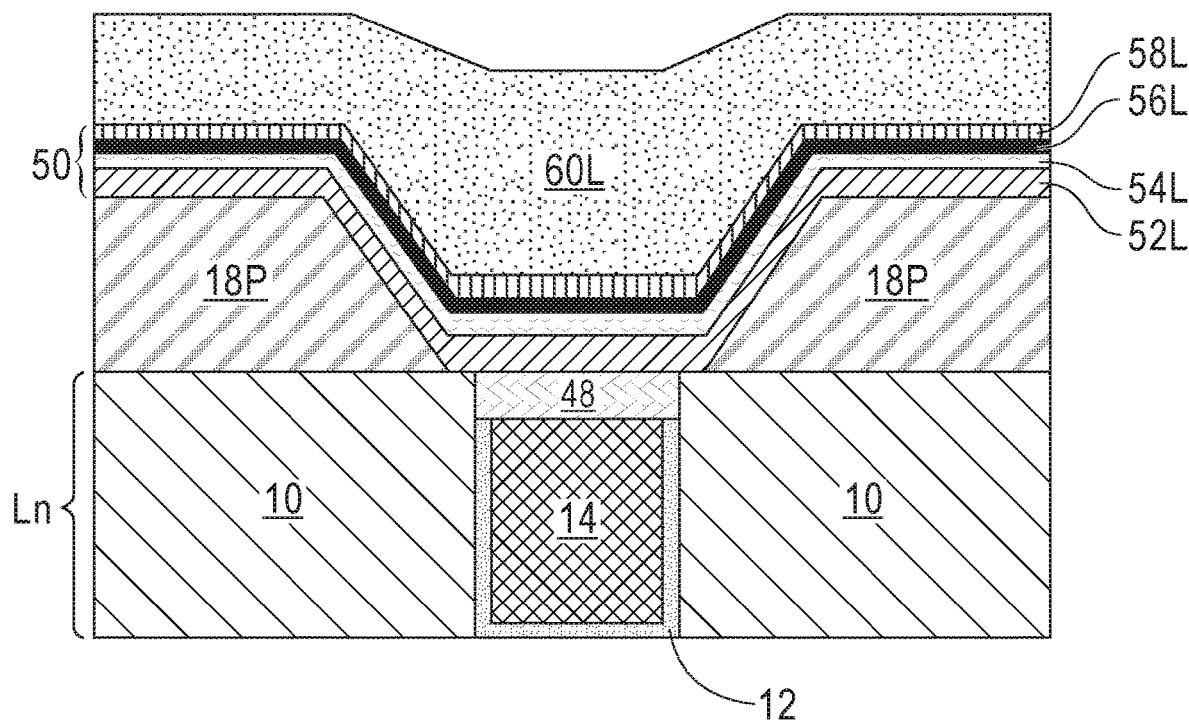
FIG. 15 is a cross sectional view of the exemplary structure of FIG. 14 after forming a magnetic tunnel junction (MTJ) material stack and a top electrode layer on the remaining portion of the dielectric capping layer and within an area defined by the lower portion of the second opening that is laterally surrounded by the remaining portion of the dielectric capping layer that has the tapered sidewall.

Referring now to FIG. 15, there is illustrated the exemplary structure of FIG. 14 after forming a magnetic tunnel junction (MTJ) material stack 50 and a top electrode layer 60L on the remaining portion of the dielectric capping layer (i.e., the dielectric capping material portion 18P) and within an area defined by the lower portion of the second opening that is laterally surrounded by the remaining portion of the dielectric capping layer (i.e., the dielectric capping material portion 18P) that has the tapered sidewall, S1. The area defined by the lower portion of the second opening 23, which is laterally surrounded by a remaining portion of the dielectric capping layer (hereinafter dielectric capping material portion 18P) that has tapered sidewall, S1, can be circular or elliptical in shape. Thus, a MTJ-containing structure that is conical in shape can be formed.

The MTJ material stack 50 includes at least a magnetic pinned layer, a tunnel barrier layer, and a magnetic free layer. In some embodiments and as shown in FIG. 15, the MTJ material stack 50 is a bottom pinned MTJ material stack that includes, from bottom to top, a magnetic pinned layer 54L, a tunnel barrier layer 56L, and a magnetic free layer 58L. Also, an optional metal seed layer 52L can also be present in the bottom pinned MTJ material stack. The bottom pinned MTJ material stack can also include a non-magnetic spacer layer (not shown) located on the magnetic free layer 54L, a second magnetic free layer (not shown) located on the non-magnetic spacer layer, and/or a MTJ cap layer (not shown) located on the magnetic free layer 58L or on the second magnetic free layer.

In other embodiments (not shown), the MTJ material stack 50 is a top pinned MTJ material stack that includes, from bottom to top, a magnetic free layer, a tunnel barrier layer, and a magnetic pinned layer; in this embodiment, the order of elements 54L and 56L are reversed from those shown in FIG. 15. In such an embodiment, the top pinned MTJ material stack can also include an optional metal seed layer located beneath the magnetic free layer, a non-magnetic spacer layer located on the magnetic free layer, a second magnetic free layer located on the non-magnetic spacer layer, and/or a MTJ cap layer located on the magnetic pinned layer.

The various material layers of the MTJ material stack 50 can be formed by utilizing one or more deposition processes such as, for example, sputtering, plasma enhanced atomic layer deposition (PEALD), plasma enhanced chemical vapor deposition (PECVD) or physical vapor deposition (PVD).

The optional metal seed layer 52L can be composed of platinum (Pt), palladium (Pd), nickel (Ni), rhodium (Rh), iridium (Ir), rhenium (Re) or alloys and multilayers thereof. In one example, the optional metal seed layer 52L is composed of platinum (Pt).

The magnetic pinned layer 54L has a fixed magnetization. The magnetic pinned layer 54L can be composed of a metal or metal alloy (or a stack thereof) that includes one or more metals exhibiting high spin polarization. In alternative embodiments, exemplary metals for the formation of the magnetic pinned layer 54L include iron, nickel, cobalt, chromium, boron, or manganese. Exemplary metal alloys can include the metals exemplified by the above. In another embodiment, the magnetic pinned layer 54L can be a multilayer arrangement having (1) a high spin polarization region formed from of a metal and/or metal alloy using the metals mentioned above, and (2) a region constructed of a material or materials that exhibit strong perpendicular magnetic anisotropy (strong PMA). Exemplary materials with strong PMA that can be used include a metal such as cobalt, nickel, platinum, palladium, iridium, or ruthenium, and can be arranged as alternating layers. The strong PMA region can also include alloys that exhibit strong PMA, with exemplary alloys including cobalt-iron-terbium, cobalt-iron-gadolinium, cobalt-chromium-platinum, cobalt-platinum, cobalt-palladium, iron-platinum, and/or iron-palladium. The alloys can be arranged as alternating layers. In one embodiment, combinations of these materials and regions can also be employed as the magnetic pinned layer 54L.

The tunnel barrier layer 56L is composed of an insulator material and is formed at such a thickness as to provide an appropriate tunneling resistance. Exemplary materials for the tunnel barrier layer 56L include magnesium oxide, aluminum oxide, and titanium oxide, or materials of higher electrical tunnel conductance, such as semiconductors or low-bandgap insulators.

The magnetic free layer 58L can be composed of a magnetic material (or a stack of magnetic materials) with a magnetization that can be changed in orientation relative to the magnetization orientation of the magnetic pinned layer 54L. Exemplary magnetic materials for the magnetic free layer 58L include alloys and/or multilayers of cobalt, iron, alloys of cobalt-iron, nickel, alloys of nickel-iron, and alloys of cobalt-iron-boron.

If present, the non-magnetic metallic spacer layer is composed of a non-magnetic metal or metal alloy that allows magnetic information to be transferred therethrough and also permits the two magnetic free layers to couple together magnetically, so that in equilibrium the first and second magnetic free layers are always parallel. The non-magnetic metallic spacer layer allows for spin torque switching between the first and second magnetic free layers.

If present, the second magnetic free layer can include one of the magnetic materials mentioned above for magnetic free layer 58L. In one embodiment, the second magnetic free layer is composed of a same magnetic material as the magnetic free layer 58L. In another embodiment, the second magnetic free layer is composed of a magnetic material that is compositionally different from the magnetic free layer 58L.

If present, the MTJ cap layer can be composed of Nb, NbN, W, WN, Ta, TaN, Ti, TiN, Ru, Mo, Cr, V, Pd, Pt, Rh, Sc, Al or other high melting point metals or conductive metal nitrides. The MTJ cap layer can have a thickness from 2 nm to 25 nm; other thicknesses are possible and can be used in the present application as the thickness of the MTJ cap layer.

The top electrode layer 60L can be composed of a conductive material such as, for example, Ta, TaN, Ti, TiN, Ru, RuN, RuTa, RuTaN, Co, CoWP, CoN, W, WN or any combination thereof. In one embodiment of the present application, top electrode layer 60L is composed of Ti/TiN. The conductive material that provides the top electrode layer 60L can be compositionally the same as, or compositionally different from, the conductive material that provides the bottom electrode 48. In the present application, the top electrode 60L can have a thickness that is from 100 nm to 500 nm; although other thicknesses are possible and can be used as the thickness of the top electrode layer 60L. The top electrode 60L can be formed by a deposition process such as, for example, sputtering, plasma enhanced atomic layer deposition (PEALD), plasma enhanced chemical vapor deposition (PECVD) or physical vapor deposition (PVD). As is shown, a portion of the top electrode layer 60L extends into an upper portion of the area defined by the lower portion of the second opening 23.

Figure 16:
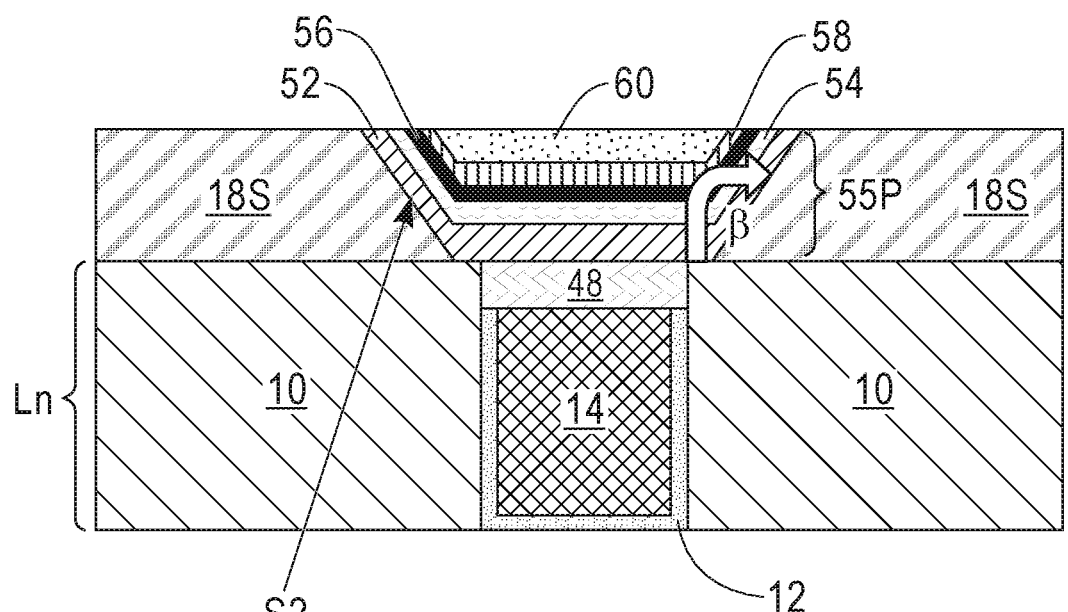
FIG. 16 is a cross sectional view of the exemplary structure of FIG. 15 after performing a planarization process which removes a portion of the top electrode layer, a portion of the MTJ material stack and an upper portion of the remaining portion of the dielectric capping layer to provide a MTJ-containing structure having a tapered sidewall which is embedded in a dielectric capping material structure, wherein the MTJ-containing structure has a topmost surface that is coplanar with a topmost surface of the dielectric capping material structure.

Referring now to FIG. 16, there is illustrated the exemplary structure of FIG. 15 after performing a planarization process which removes a portion of the top electrode layer 60L, a portion of MTJ material stack 50 and an upper portion of the remaining portion of the dielectric capping layer (i.e., first dielectric capping material portion 18P) to provide a MTJ-containing structure 55P having a tapered sidewall, S2, which is embedded in a dielectric capping material structure 18S, wherein the MTJ-containing structure 55P has a topmost surface that is coplanar with a topmost surface of the dielectric capping material structure 18S. In accordance with the present application, the tapered sidewall, S2, of the MTJ-containing structure 55P slopes outward from a bottommost surface of the MTJ-containing structure 55P to the topmost surface of the MTJ-containing structure 55P. In one embodiment, the tapered sidewall, S2, of the MTJ-containing structure 55P has an angle, ß, as measured from the bottommost surface of the MTJ-containing structure 55P to the tapered sidewall, S2, that is from 30° to 70°. The planarization process may include chemical mechanical polishing and/or grinding.

The MTJ-containing structure 55P includes a remaining (i.e., non-removed) portion of the MTJ material stack 50 and a remaining (i.e., non-removed) portion of the top electrode layer 60L. In the depicted embodiment, the remaining (i.e., non-removed) portion of the MTJ material stack 50 includes an optional metal seed layer 52, a magnetic pinned layer 54, a tunnel barrier layer 56, and a magnetic free layer 58. The remaining (i.e., non-removed) portion of the MTJ material stack 50 may include any of the other elements mentioned above for the MTJ material stack 50. The remaining (i.e., non-removed) portion of the top electrode layer 60L is now designated as top electrode 60.

As is shown, the top electrode 60 of the MTJ-containing structure 55P has a topmost surface that is coplanar with a topmost surface of each of the various layers that constituent the remaining (i.e., non-removed) portion of the MTJ material stack 50. The dielectric capping material structure 18S is composed of a second remaining portion of the dielectric capping material layer portion 18P mentioned above. The dielectric capping material structure 18S has a tapered sidewall that is equivalent to S1 mentioned above.

Figure 17:
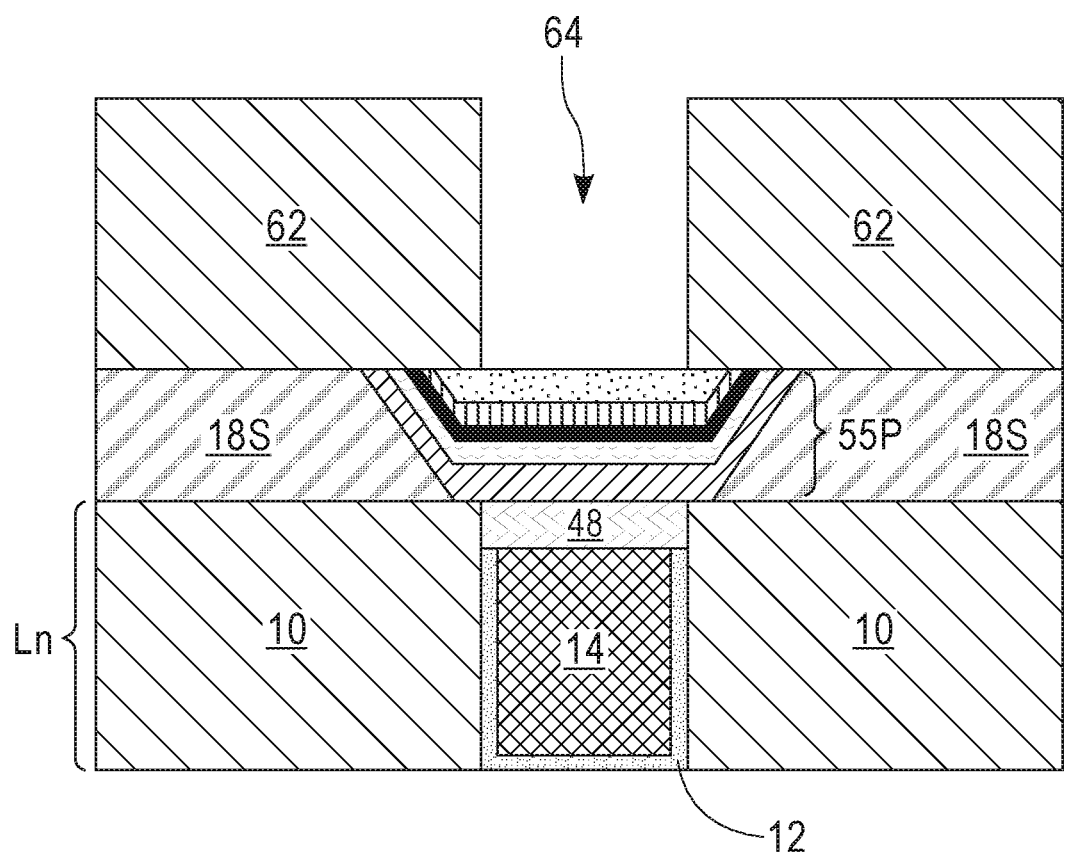
FIG. 17 is a cross sectional view of the exemplary structure of FIG. 16 after forming a second interconnect dielectric material layer that contains an opening that physically exposes the top electrode of the MTJ-containing structure.

Referring now to FIG. 17, there is illustrated the exemplary structure of FIG. 16 after forming a second interconnect dielectric material layer 62 that contains an opening 64 that physically exposes the top electrode 60 of the MTJ-containing structure 55P. The second interconnect dielectric material layer 62 may include one of the interconnect dielectric materials mentioned above. The interconnect dielectric material that provides the second interconnect dielectric material layer 62 may be compositionally the same as, or compositionally different from, the interconnect dielectric material that provides the first interconnect dielectric material layer 10. The second interconnect dielectric material layer 62 can be formed utilizing any conventional deposition process. Opening 64 can be formed by lithography and etching.

Figure 18:
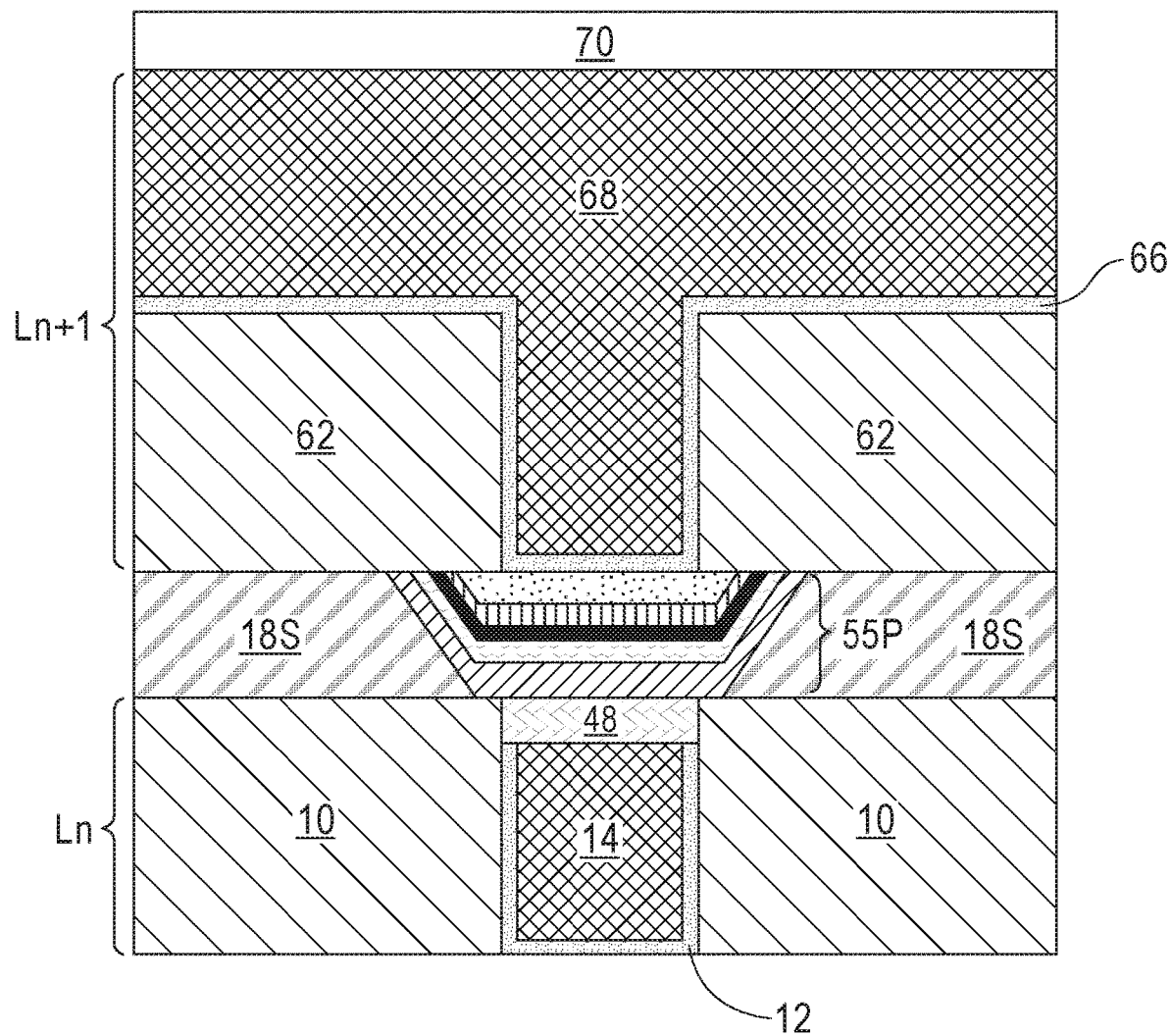
FIG. 18 is a cross sectional view of the exemplary structure of FIG. 17 after forming an electrically conductive layer in the opening and on the second interconnect dielectric material layer, and another dielectric capping layer on the electrically conductive layer.

Referring now to FIG. 18, there is illustrated the exemplary structure of FIG. 17 after forming an electrically conductive layer 68 in the opening 64 and on the second interconnect dielectric material layer 62, and another dielectric capping layer 70 on the electrically conductive layer 68. In some embodiments, a diffusion barrier material layer 66 can be formed prior to forming the electrically conductive layer 68. The electrically conductive layer 68 has a first portion that extends entirely through the second interconnect dielectric material layer 62 and a second portion that is present on the topmost surface of the second interconnect dielectric material layer 62.

The diffusion barrier material layer 66 includes one of the diffusion barrier materials mentioned above for the diffusion barrier liner 12. The diffusion barrier material layer 66 can be formed utilizing a conventional deposition processes such as, for example, chemical vapor deposition (CVD) or plasma enhanced chemical vapor deposition (PECVD).

The electrically conductive layer 68 can include copper (Cu), aluminum (Al), tungsten (W), or alloys thereof. The electrically conductive layer 68 can be formed utilizing any conventional deposition process including, for example, chemical vapor deposition (CVD) or plasma enhanced chemical vapor deposition (PECVD, sputtering or plating.

The dielectric capping layer 70 may include one of the dielectric capping materials mentioned above for dielectric capping layer 18L. The dielectric capping layer 70 can be formed utilizing any well know deposition process including, for example, chemical vapor deposition (CVD) or plasma enhanced chemical vapor deposition (PEVD), or spin-on coating.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A magnetic structure comprising:
   a dielectric material layer located on a lower interconnect level; and
   a magnetic inductor having a tapered sidewall and embedded in a dielectric capping material structure that is located on the dielectric material layer, wherein the magnetic inductor has a topmost surface that is coplanar with a topmost surface of the dielectric capping material structure.

2. The magnetic structure of claim 1, wherein the magnetic inductor comprises alternating layers of a dielectric material and a magnetic material.

3. The magnetic structure of claim 1, wherein the tapered sidewall of the magnetic inductor slopes outward from a bottommost surface of the magnetic inductor to the topmost surface of the magnetic inductor.

4. The magnetic structure of claim 1, wherein the lower interconnect level comprises at least one electrically conductive structure embedded in an interconnect dielectric material layer.

5. The magnetic structure of claim 4, wherein the magnetic inductor is entirely spaced apart from the at least one electrically conductive structure by the dielectric material layer.

6. The magnetic structure of claim 1, further comprising an upper interconnect level located above the magnetic inductor and the dielectric capping material structure.

7. The magnetic structure of claim 6, wherein the upper interconnect level comprises at least one electrically conductive structure embedded in an interconnect dielectric material layer.

8. A magnetic structure comprising:
a lower interconnect level comprising an electrically conductive structure embedded in an interconnect dielectric material layer;
a bottom electrode located on a surface of the electrically conductive structure;
a MTJ-containing structure having a tapered sidewall and embedded in a dielectric capping material structure that is located on the lower interconnect level, wherein the MTJ-containing structure contacts the bottom electrode and comprises a MTJ pillar and a top electrode, wherein the MTJ pillar comprises a magnetic pinned layer, a tunnel barrier layer, and a magnetic free layer, and wherein a topmost surface of the top electrode is coplanar with a topmost surface of each of the dielectric capping material structure, the magnetic pinned layer, the tunnel barrier layer, and the magnetic free layer; and
an upper interconnect level located above the dielectric capping material structure and the MTJ-containing structure.

9. The magnetic structure of claim 8, wherein the MTJ pillar is located between the top electrode and the bottom electrode.

10. The magnetic structure of claim 9, wherein the MTJ pillar is a top pinned MTJ material stack.

11. The magnetic structure of claim 9, wherein the MTJ pillar is a bottom pined MTJ material stack.

12. The magnetic structure of claim 8, wherein the bottom electrode is located on a recessed surface of the electrically conductive structure and is embedded in the interconnect dielectric material layer, wherein the bottom electrode has a topmost surface that is coplanar with a topmost surface of the interconnect dielectric material layer.

13. The magnetic structure of claim 8, wherein the upper interconnect level comprises another interconnect dielectric material layer having an electrically conductive layer that has a first portion that extends entirely through the another interconnect dielectric material layer and a second portion that is present on the topmost surface of the another interconnect dielectric material layer.

14. The magnetic structure of claim 13, wherein the first portion of the electrically conductive material layer contacts the top electrode of the MTJ-containing structure.

15. A method of forming a magnetic structure, the method comprising:
forming a structure comprising a dielectric material layer located on a lower interconnect level, a dielectric capping layer located on the dielectric material layer, and a sacrificial dielectric material layer located on the dielectric capping layer;
performing a first patterning step to provide a first opening in the sacrificial dielectric material layer that physically exposes a portion of the dielectric capping layer, wherein the first opening has a first critical dimension and is laterally surrounded by a first remaining portion of the sacrificial dielectric material layer that has a vertical sidewall relative to a horizontal surface of the interconnect level;
performing a second patterning step to convert the first opening into a second opening having a second critical dimension that is greater than the first critical dimension, wherein the second opening extends entirely through both the first remaining portion of the sacrificial dielectric material layer and the dielectric capping layer to physically expose a portion of the dielectric material layer, wherein an upper portion of the second opening is laterally surrounded by a second remaining portion of the sacrificial dielectric material layer that has a vertical sidewall relative to a horizontal surface of the interconnect level, and a lower portion of the second opening is laterally surrounded by a remaining portion of the dielectric capping layer that has a tapered sidewall;
removing the second remaining portion of the sacrificial dielectric material layer;
forming a magnetic inductor material stack on the remaining portion of the dielectric capping layer and within an area defined by the lower portion of the second opening that is laterally surrounded by the remaining portion of the dielectric capping layer that has the tapered sidewall;
forming a second dielectric material layer on the magnetic inductor material stack; and
performing a planarization process which removes the entirety of the second dielectric material layer, a portion of the inductor material stack and an upper portion of the remaining portion of the dielectric capping layer to provide a magnetic inductor having a tapered sidewall which is embedded in a dielectric capping material structure, wherein the magnetic inductor has a topmost surface that is coplanar with a topmost surface of the dielectric capping material structure.

16. The method of claim 15, wherein the magnetic inductor material stack includes alternating layers of a dielectric material and a magnetic material.

17. The method of claim 15, wherein the tapered sidewall of the magnetic inductor slopes outward from a bottommost surface of the magnetic inductor to the topmost surface of the magnetic inductor.

18. The method of claim 15, wherein the lower interconnect level comprises at least one electrically conductive structure embedded in an interconnect dielectric material layer, and the magnetic inductor is entirely spaced apart from the at least one electrically conductive structure by the dielectric material layer.

19. The method of claim 15, further comprising forming an upper interconnect level above the magnetic inductor and the dielectric capping material structure.

20. A method of forming a magnetic structure, the method comprising:
forming a bottom electrode on a surface of an electrically conductive structure that is embedded in a first interconnect dielectric material layer of a lower interconnect level;
forming a dielectric capping layer on the lower interconnect level and the bottom electrode,
forming a sacrificial dielectric material layer on the dielectric capping layer;
performing a first patterning step to provide a first opening in the sacrificial dielectric material layer that physically exposes a portion of the dielectric capping layer, wherein the first opening has a first critical dimension and is laterally surrounded by a first remaining portion of the sacrificial dielectric material layer that has a vertical sidewall relative to a horizontal surface of the interconnect level;
performing a second patterning step to convert the first opening into a second opening having a second critical dimension that is greater than the first critical dimension, wherein the second opening extends entirely through both the first remaining portion of the sacrificial dielectric material layer and the dielectric capping layer to physically expose a portion of the bottom electrode, wherein an upper portion of the second opening is laterally surrounded by a second remaining portion of the sacrificial dielectric material layer that has a vertical sidewall relative to a horizontal surface of the interconnect level, and a lower portion of the second opening is laterally surrounded by a remaining portion of the dielectric capping layer that has a tapered sidewall;
removing the second remaining portion of the sacrificial dielectric material layer;
forming a magnetic tunnel junction (MTJ) material stack and a top electrode layer on the remaining portion of the dielectric capping layer and within an area defined by the lower portion of the second opening that is laterally surrounded by the remaining portion of the dielectric capping layer that has the tapered sidewall; and
performing a planarization process which removes a portion of the top electrode layer, a portion of MTJ material stack and an upper portion of the remaining portion of the dielectric capping layer to provide a MTJ-containing structure having a tapered sidewall which is embedded in a dielectric capping material structure, wherein the MTJ-containing structure has a topmost surface that is coplanar with a topmost surface of the dielectric capping material structure.

21. The method of claim 20, wherein the MTJ material stack is a top pinned MTJ material stack.

22. The method of claim 20, wherein the MTJ material stack is a bottom pined MTJ material stack.

23. The method of claim 20, wherein the lower interconnect level comprises an electrically conductive structure embedded in an interconnect dielectric material layer, and wherein the bottom electrode is located on a recessed surface of the electrically conductive structure that is embedded in the interconnect dielectric material layer, wherein the bottom electrode has a topmost surface that is coplanar with a topmost surface of the interconnect dielectric material layer.

24. The method of claim 20, further comprising forming an upper interconnect level above the remaining portion of the dielectric capping layer, wherein the upper interconnect level comprises another interconnect dielectric material layer having an electrically conductive layer that has a first portion that extends entirely through the another interconnect dielectric material layer and a second portion that is present on the topmost surface of the another interconnect dielectric material layer.

25. The method of claim 24, wherein the first portion of the electrically conductive material layer contacts a top electrode of the MTJ-containing structure.

\* \* \* \* \*